US011841763B2

(12) United States Patent
Song et al.

(10) Patent No.: US 11,841,763 B2
(45) Date of Patent: Dec. 12, 2023

(54) SEMICONDUCTOR MEMORY DEVICES WITH ECC ENGINE DEFECT DETERMINATION BASED ON TEST SYNDROME, TEST PARITY, EXPECTED DECODING STATUS AND RECEIVED DECODING STATUS

(71) Applicant: SAMSUNG ELECTRONICS CO., LTD., Suwon-si (KR)

(72) Inventors: Yeonggeol Song, Seoul (KR); Sungrae Kim, Seoul (KR); Kijun Lee, Seoul (KR); Sunggi Ahn, Jinju-si (KR); Yesin Ryu, Seoul (KR); Sukhan Lee, Seoul (KR)

(73) Assignee: Samsung Electronics Co., Ltd.

( * ) Notice: Subject to any disclaimer, the term of this patent is extended or adjusted under 35 U.S.C. 154(b) by 1 day.

(21) Appl. No.: 17/535,762

(22) Filed: Nov. 26, 2021

(65) Prior Publication Data

US 2022/0405165 A1 Dec. 22, 2022

(30) Foreign Application Priority Data

Jun. 17, 2021 (KR) ........................ 10-2021-0078606

(51) Int. Cl.
*G06F 11/277* (2006.01)
*G06F 11/10* (2006.01)
*G11C 29/04* (2006.01)

(52) U.S. Cl.
CPC .......... *G06F 11/1044* (2013.01); *G11C 29/04* (2013.01); *G06F 11/277* (2013.01)

(58) Field of Classification Search
CPC ............. G06F 11/1044; G06F 11/2215; G06F 11/1048; G06F 11/273; G06F 11/277
See application file for complete search history.

(56) References Cited

U.S. PATENT DOCUMENTS

| 4,527,269 | A | * | 7/1985 | Wood | G06F 11/2215 |
| 5,056,089 | A | * | 10/1991 | Furuta | G06F 11/1008 |
| | | | | | 714/E11.036 |
| 5,487,077 | A | | 1/1996 | Hassner et al. | |
| 5,925,144 | A | * | 7/1999 | Sebaa | G01R 31/31813 |
| | | | | | 714/733 |
| 6,295,617 | B1 | * | 9/2001 | Sonobe | G06F 11/1008 |
| | | | | | 714/E11.036 |

(Continued)

FOREIGN PATENT DOCUMENTS

JP 19990175410 A 7/1999

*Primary Examiner* — Joseph O Schell
(74) *Attorney, Agent, or Firm* — Fish & Richardson P.C.

(57) ABSTRACT

A semiconductor memory device includes a buffer die and a plurality of memory dies. Each of the memory dies includes a memory cell array, an error correction code (ECC) engine and a test circuit. The memory cell array includes a plurality of memory cell rows, each including a plurality of volatile memory cells. The test circuit, in a test mode, generates a test syndrome and an expected decoding status flag indicating error status of the test syndrome, receives test parity data generated by the ECC engine based on the test syndrome and a decoding status flag indicating error status of the test parity data, and determines whether the ECC engine has a defect based on comparison of the test syndrome and the test parity data and a comparison of the expected decoding status flag and the decoding status flag.

20 Claims, 23 Drawing Sheets

(56) References Cited

U.S. PATENT DOCUMENTS

| | | | |
|---|---|---|---|
| 6,301,682 B1 | 10/2001 | Knefel | |
| 6,938,193 B1* | 8/2005 | Honda | G06F 11/1008 |
| | | | 714/766 |
| 7,043,611 B2 | 5/2006 | Mcclannahan et al. | |
| 7,318,183 B2 | 1/2008 | Ito et al. | |
| 8,935,592 B2 | 1/2015 | Campbell et al. | |
| 9,691,505 B2 | 6/2017 | Das et al. | |
| 10,044,475 B2 | 8/2018 | Chung et al. | |
| 10,706,950 B1* | 7/2020 | Gallagher | G11C 29/46 |
| 11,663,095 B2* | 5/2023 | Langadi | G06F 11/1044 |
| | | | 714/763 |
| 2003/0182611 A1* | 9/2003 | Wu | G06F 11/1052 |
| | | | 714/752 |
| 2005/0036371 A1* | 2/2005 | Kushida | G06F 11/1008 |
| | | | 365/201 |
| 2005/0210186 A1* | 9/2005 | Arakawa | G06F 11/106 |
| | | | 711/106 |
| 2010/0023840 A1 | 1/2010 | Nakao et al. | |
| 2011/0219266 A1* | 9/2011 | Rao | G11C 29/02 |
| | | | 714/25 |
| 2016/0378597 A1* | 12/2016 | Chung | G11C 29/52 |
| | | | 714/764 |
| 2019/0051370 A1* | 2/2019 | Azam | G11C 29/36 |
| 2019/0176838 A1* | 6/2019 | Kakoee | G06F 11/2215 |

\* cited by examiner

FIG. 11

ISM $$\begin{pmatrix} 1 & 0 & 0 & 0 & 0 & 0 & 0 & 0 & 0 & 0 & 0 & 0 & 0 & 0 & 0 \\ 0 & 1 & 0 & 0 & 0 & 0 & 0 & 0 & 0 & 0 & 0 & 0 & 0 & 0 & 0 \\ 0 & 0 & 1 & 0 & 0 & 0 & 0 & 0 & 0 & 0 & 0 & 0 & 0 & 0 & 0 \\ 0 & 0 & 0 & 1 & 0 & 0 & 0 & 0 & 0 & 0 & 0 & 0 & 0 & 0 & 0 \\ 0 & 0 & 0 & 0 & 1 & 0 & 0 & 0 & 0 & 0 & 0 & 0 & 0 & 0 & 0 \\ 0 & 0 & 0 & 0 & 0 & 1 & 0 & 0 & 0 & 0 & 0 & 0 & 0 & 0 & 0 \\ 0 & 0 & 0 & 0 & 0 & 0 & 1 & 0 & 0 & 0 & 0 & 0 & 0 & 0 & 0 \\ 0 & 0 & 0 & 0 & 0 & 0 & 0 & 1 & 0 & 0 & 0 & 0 & 0 & 0 & 0 \\ 0 & 0 & 0 & 0 & 0 & 0 & 0 & 0 & 1 & 0 & 0 & 0 & 0 & 0 & 0 \\ 0 & 0 & 0 & 0 & 0 & 0 & 0 & 0 & 0 & 1 & 0 & 0 & 0 & 0 & 0 \\ 0 & 0 & 0 & 0 & 0 & 0 & 0 & 0 & 0 & 0 & 1 & 0 & 0 & 0 & 0 \\ 0 & 0 & 0 & 0 & 0 & 0 & 0 & 0 & 0 & 0 & 0 & 1 & 0 & 0 & 0 \\ 0 & 0 & 0 & 0 & 0 & 0 & 0 & 0 & 0 & 0 & 0 & 0 & 1 & 0 & 0 \\ 0 & 0 & 0 & 0 & 0 & 0 & 0 & 0 & 0 & 0 & 0 & 0 & 0 & 1 & 0 \\ 0 & 0 & 0 & 0 & 0 & 0 & 0 & 0 & 0 & 0 & 0 & 0 & 0 & 0 & 1 \end{pmatrix}_{p \times p}$$

FIG. 14

ZSM

```
0 0 0 0 0 0 0 0 0 0 0 0 0 0 0
0 0 0 0 0 0 0 0 0 0 0 0 0 0 0
0 0 0 0 0 0 0 0 0 0 0 0 0 0 0
0 0 0 0 0 0 0 0 0 0 0 0 0 0 0
0 0 0 0 0 0 0 0 0 0 0 0 0 0 0
0 0 0 0 0 0 0 0 0 0 0 0 0 0 0
0 0 0 0 0 0 0 0 0 0 0 0 0 0 0
0 0 0 0 0 0 0 0 0 0 0 0 0 0 0
0 0 0 0 0 0 0 0 0 0 0 0 0 0 0
0 0 0 0 0 0 0 0 0 0 0 0 0 0 0
0 0 0 0 0 0 0 0 0 0 0 0 0 0 0
0 0 0 0 0 0 0 0 0 0 0 0 0 0 0
0 0 0 0 0 0 0 0 0 0 0 0 0 0 0
0 0 0 0 0 0 0 0 0 0 0 0 0 0 0
0 0 0 0 0 0 0 0 0 0 0 0 0 0 0
0 0 0 0 0 0 0 0 0 0 0 0 0 0 0
``` p p $$T\_SDR\_M = HS_{21} \times C^T$$
$$T\_SDR\_L = HS_{22} \times C^T$$

FIG. 20

T_SDR = 00000000000000001 | 1001000100100000

T_SDR_M | T_SDR_L

SEMICONDUCTOR MEMORY DEVICES WITH ECC ENGINE DEFECT DETERMINATION BASED ON TEST SYNDROME, TEST PARITY, EXPECTED DECODING STATUS AND RECEIVED DECODING STATUS

CROSS-REFERENCE TO RELATED APPLICATION

This application claims priority under 35 USC § 119 to Korean Patent Application No. 10-2021-0078606, filed on Jun. 17, 2021, in the Korean Intellectual Property Office (KIPO), the disclosure of which is incorporated in its entirety by reference herein.

BACKGROUND

1. Technical Field

Exemplary embodiments relate to memories, and more particularly to semiconductor memory devices capable of detecting a defect of an error correction code (ECC) engine.

2. Discussion of the Related Art

Both the capacity and speed of a semiconductor memory, which may be used as a storage device in most known memory systems, are increasing. Furthermore, various attempts are being made for mounting a memory with a larger capacity within a smaller space and efficiently operating the memory.

Recently, in order to increase the integration of a semiconductor memory, a 3-dimensional (3D) structure including a plurality of stacked memory chips is being used instead of a 2-dimensional (2D) structure. Based on high demand for large integration and large capacity memories, a structure that employs a 3D stacked structure of the memory chips for increasing the capacity of a memory, thereby increasing integration by reducing the size of a semiconductor chip, and correspondingly reducing cost of manufacturing of the same has been developed.

SUMMARY

Some exemplary embodiments provide a semiconductor memory device capable of detecting a defect in an error correction code (ECC) engine using a test circuit.

According to some exemplary embodiments, a semiconductor memory device includes a buffer die and a plurality of memory dies stacked in the buffer die and connecting to the buffer die through a plurality of through silicon vias (TSVs). The buffer die communicates with an external device. Each of the plurality of memory dies includes a memory cell array, an error correction code (ECC) engine and a test circuit. The memory cell array includes a plurality of memory cell rows, each including a plurality of volatile memory cells coupled to a plurality of word-lines and a plurality of bit-lines. The ECC engine, in a normal mode, performs a Reed-Solomon (RS) encoding on data stored in the memory cell array and performs a RS decoding on data read from the memory cell array to correct an error of the read data by unit of a symbol. The test circuit, in a test mode, generates a test syndrome and an expected decoding status flag indicating error status of the test syndrome, receives a test parity data generated by the ECC engine based on the test syndrome and a decoding status flag indicating error status of the test parity data, and determines whether the ECC engine has a defect based on a comparison of the test syndrome and the test parity data and comparison of the expected decoding status flag and the decoding status flag.

According to some exemplary embodiments, a semiconductor memory device includes a memory cell array, an error correction code (ECC) engine a test circuit and a control logic circuit. The memory cell array includes a plurality of memory cell rows, each including a plurality of volatile memory cells coupled to a plurality of word-lines and a plurality of bit-lines. The ECC engine, in in a normal mode, performs a Reed-Solomon (RS) encoding on data stored in the memory cell array and performs a RS decoding on data read from the memory cell array to correct an error of the read data by unit of a symbol. The test circuit, in a test mode, generates a test syndrome and an expected decoding status flag indicating error status of the test syndrome, receive a test parity data generated by the ECC engine based on the test syndrome and a decoding status flag indicating error status of the test parity data, and determines whether the ECC engine has a defect based on comparison of the test syndrome and the test parity data and a comparison of the expected decoding status flag and the decoding status flag. The control logic circuit controls the ECC engine and the test circuit based on a command and an address from an external device.

According to some exemplary embodiments, a semiconductor memory device includes a buffer die and a plurality of memory dies stacked on the buffer die and connected to the buffer die through a plurality of through silicon vias (TSVs). The buffer die communicates with an external device. Each of the plurality of memory dies includes a memory cell array, an error correction code (ECC) engine and a test circuit. The memory cell array includes a plurality of memory cell rows, each including a plurality of volatile memory cells coupled to a plurality of word-lines and a plurality of bit-lines. The ECC engine, in a normal mode, performs a Reed-Solomon (RS) encoding on data stored in the memory cell array and performs a RS decoding on data read from the memory cell array to correct an error of the read data by unit of a symbol. The test circuit, in a test mode, generates a test syndrome and an expected decoding status flag indicating error status of the test syndrome, receives test parity data generated by the ECC engine based on the test syndrome and a decoding status flag indicating error status of the test parity data, and determines whether the ECC engine has a defect based on a comparison of the test syndrome and the test parity data and a comparison of the expected decoding status flag and the decoding status flag. The test circuit generates the test syndrome and the expected decoding status flag sequentially with respect to a plurality of error patterns. The ECC engine generates the decoding status flag and the test parity data based on the test syndrome that is sequentially generated. The test circuit determines the defect of the ECC engine based on the expected decoding status flag, the test parity data and the test syndrome that is sequentially generated.

Accordingly, the test circuit test mode, may generate a test syndrome and an expected decoding status flag associated with an error status of the test syndrome, may receive test parity data generated by the ECC engine based on the test syndrome and a decoding status flag associated with error status of the test parity data, and may determine whether the ECC engine has a defect with respect to a plurality of error patterns based on a comparison of the test syndrome and the test parity data and a comparison of the expected decoding status flag and the decoding status flag.

BRIEF DESCRIPTION OF THE DRAWINGS

Illustrative, non-limiting exemplary embodiments will be more clearly understood from the following detailed description in conjunction with the accompanying drawings.

FIG. 11 illustrates a unit sub matrix in the parity generation matrix in FIG. 10.

FIG. 14 illustrates a zero sub matrix in the parity check matrix in FIG. 13.

FIG. 20 illustrates an example of the test syndrome according to exemplary embodiments.

DETAILED DESCRIPTION OF THE PREFERRED EMBODIMENTS

Exemplary embodiments will be described more fully hereinafter with reference to the accompanying drawings.

Figure 1:
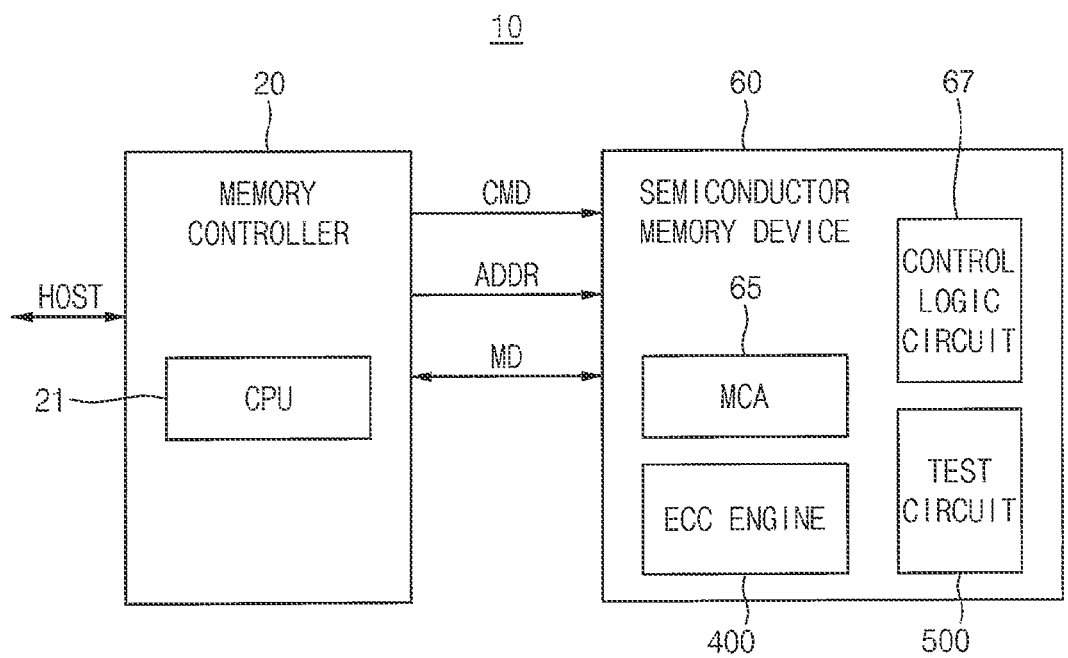
FIG. 1 is a block diagram illustrating a memory system according to exemplary embodiments.

FIG. 1 is a block diagram illustrating a memory system according to exemplary embodiments.

Referring to FIG. 1, a memory system 10 may include a memory controller 20 and a semiconductor memory device 60. The memory controller 20 may include a central processing unit (CPU) 21, may provide a command (signal) CMD, an address (signal) ADDR to the semiconductor memory device 60, and may exchange a main data MD with the semiconductor memory device 60.

The memory controller 20 may access the semiconductor memory device 60 based on a request from an external host. The memory controller 20 may communicate with the host through various protocols. The CPU 21 may control overall operation of the memory controller 20.

The semiconductor memory device 60 may include a memory cell array (MCA) 65, a control logic circuit 67, an error correction code (ECC) engine 400 and a test circuit 500.

The memory cell array 65 may include a plurality of memory cell rows, each of the plurality of memory cell rows includes a plurality of volatile memory cells coupled to a plurality of word-lines and a plurality of bit-lines.

The ECC engine 400, in a write operation of a normal mode, may perform a Reed-Solomon (RS) encoding on the main data MD to generate a parity data and may store the main data MD and the parity data in a target page of the memory cell array 62.

The ECC engine 400, in a read operation of the normal mode, may perform a RS decoding on the main data MD and the parity data read from the target page to correct an error of the main data MD by unit of a symbol.

Through the specification, the symbol is a basic unit of the RS encoding and the RS decoding and refers to data including predetermined data bits. For example, one symbol may include 16-bit data bits.

The test circuit 500, in a test mode, may generate a test syndrome and an expected decoding status flag associated with the test syndrome, may receive a test parity data generated by the ECC engine based on the test syndrome and a decoding status flag associated with the test parity data, and may determine whether the ECC engine 400 has a defect based on comparison of the test syndrome and the test parity data and a comparison of the expected decoding status flag and the decoding status flag.

The control logic circuit 67 may control the ECC engine 400 and the test circuit 500 based on the command CMD and the address ADDR from the memory controller 20.

Figure 2:
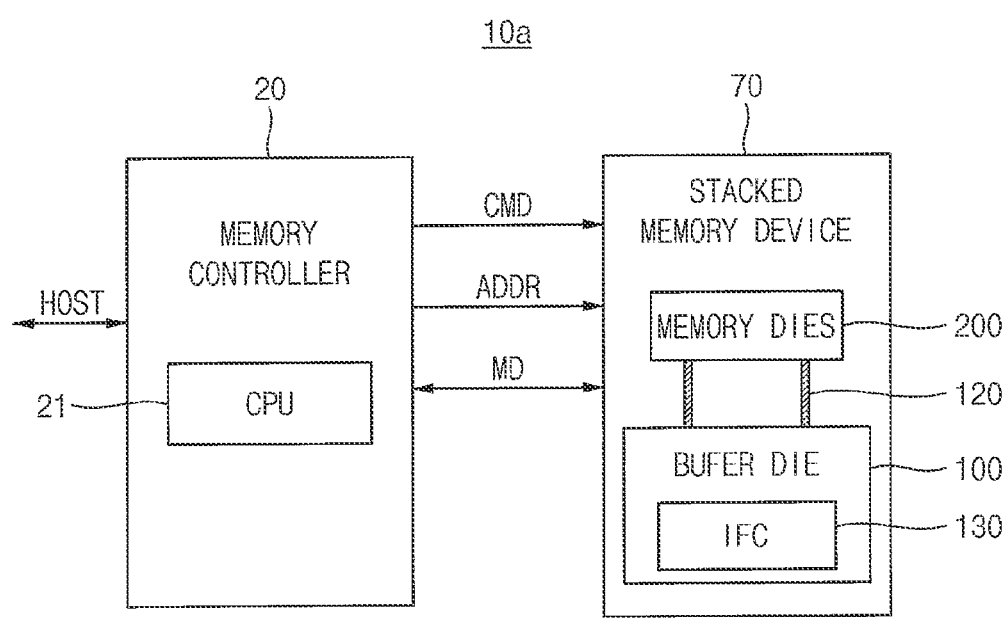
FIG. 2 is a block diagram illustrating a memory system according to exemplary embodiments.

FIG. 2 is a block diagram illustrating a memory system according to exemplary embodiments.

Referring to FIG. 2, a memory system 10a includes a memory controller 20 and a stacked memory device 70. The stacked device 70 may be referred to as a semiconductor memory device. Description on the memory controller 20 is the same as the description with reference to FIG. 1, and thus, description on the memory controller 20 will be omitted as redundant.

The stacked memory device 70 may include a buffer die 100 and a plurality of memory dies 200 stacked on the buffer die 100. The buffer die 200 and the memory dies 200 may be sequentially stacked on each other. The memory dies 200 stacked on the buffer die 210 may be electrically connected to the buffer die 100 through conducting means. The conducting means may be one or more through silicon via (TSV)s 120. The memory dies 200 may be referred to as core dies.

The buffer die 100 may communicate with the memory controller 20 and each of the memory dies 100 may be a dynamic random access memory (DRAM) device including a plurality of dynamic memory cells, such as Double Data Rate (DDR) Synchronous Dynamic Random Access Memory (SDRAM). Each of the memory dies 100 may include a memory cell array, an ECC engine, a test circuit and a control logic circuit.

The buffer die 100 may include an interface circuit 130. The interface circuit 130 is coupled to the TSVs 120, and may provide the memory controller 20 with a decision signal associated with a test from one of the memory dies 200.

Figure 3:
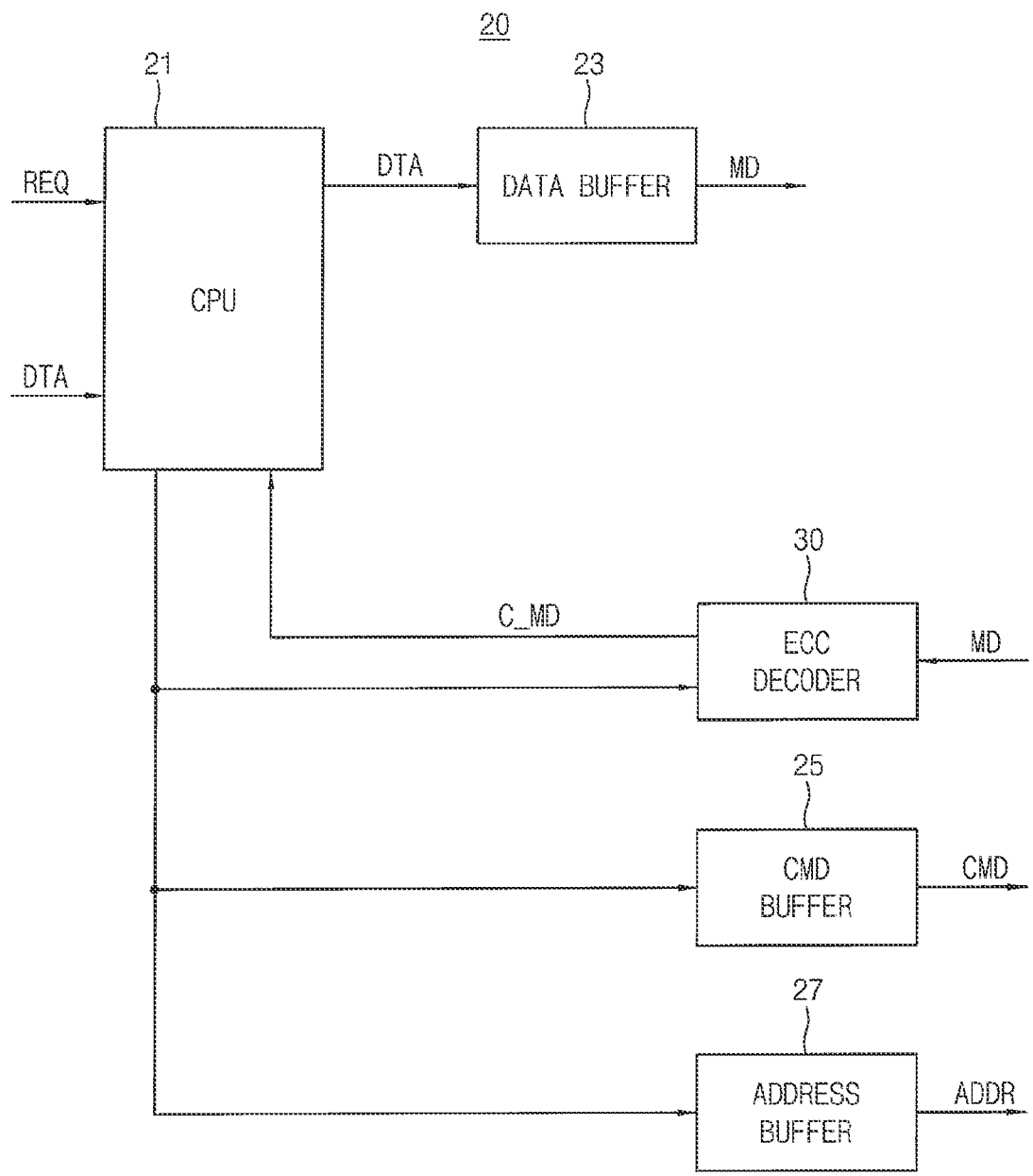
FIG. 3 is a block diagram illustrating an example of the memory controller in FIG. 2 according to exemplary embodiments.

FIG. 3 is a block diagram illustrating an example of the memory controller in FIG. 2 according to exemplary embodiments.

Referring to FIG. 3, the memory controller 20 may include the CPU 21, a data buffer 23, an ECC decoder 30, a command buffer 25 and an address buffer 27. In an exemplary embodiment, the ECC decoder 30 may not be included in the memory controller 20.

The CPU 21 receives a request REQ and data DTA from the host, and provides the data DTA to the data buffer 23.

The data buffer 23 buffers the data DTA to provide the main data MD to the stacked memory device 70 (or the semiconductor memory device 60).

The ECC decoder 30, in a read operation, receives the main data MD from the stacked memory device 70, performs an ECC decoding on the main data MD to correct at least one error in the main data MD to provide a corrected data C_MD to the CPU 21.

The command buffer 25 stores the command CMD corresponding to the request REQ and transmits the command CMD to the stacked memory device 70 under control of the CPU 21. The address buffer 27 stores the address ADDR and transmits the address ADDR to the stacked memory device 70 under control of the CPU 21.

Figure 4:
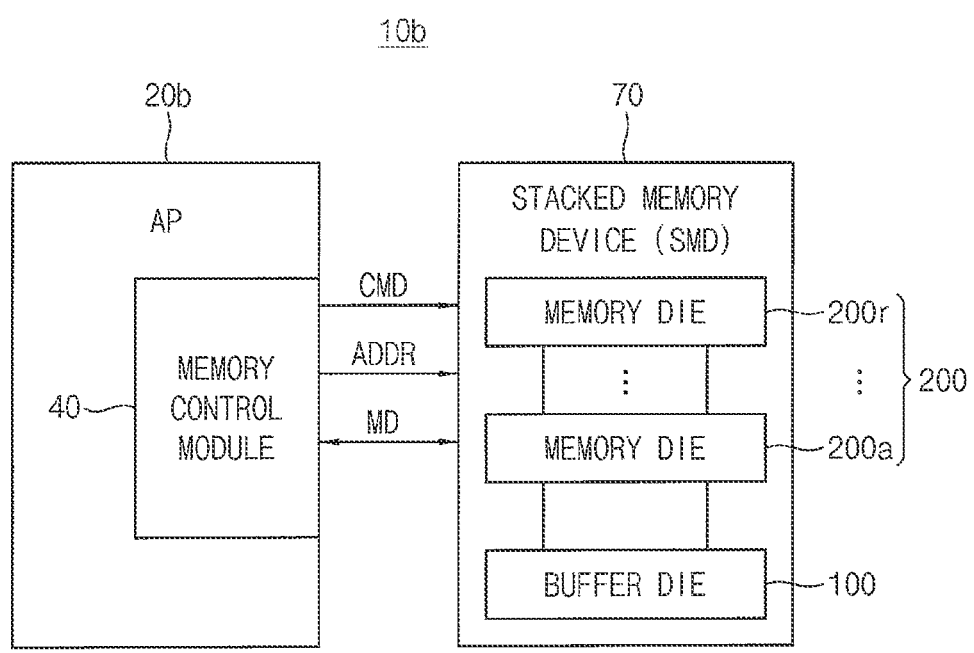
FIG. 4 is a block diagram illustrating a data processing system according to exemplary embodiments.

FIG. 4 is a block diagram illustrating a data processing system according to exemplary embodiments.

Referring to FIG. 4, a data processing system (or, a memory system) 10*b* may include an application processor 20*b* and a stacked memory device 70. The application processor 20*b* may include a memory control module 40 and the memory control module 40 included in application processor 20*b* and the stacked memory device 70 may constitute a memory system. The stacked memory device 70 includes the buffer die 100 and memory devices 200 and the memory dies 200 include a plurality memory dies 200*a*~200*k* which are stacked on top of another memory die.

The application processor 20*b* may perform the function of the host. Further, the application processor 20*b* may be implemented as a system on chip (SoC). The SoC may include a system bus (not illustrated) to which a protocol having a predetermined standard bus specification is applied, and may include various types of proprietary cores connected to the system bus.

The memory control module 40 may perform the function of the memory controller 20 in FIG. 2.

In exemplary embodiments, the application processor 20*b* may include a graphic processing unit (GPU) instead of the memory control module 40 and the GPU may perform the function of the memory controller 20 in FIG. 2. The GPU may store, in the stacked memory device 70, data which is generated during graphic processing.

Figure 5:
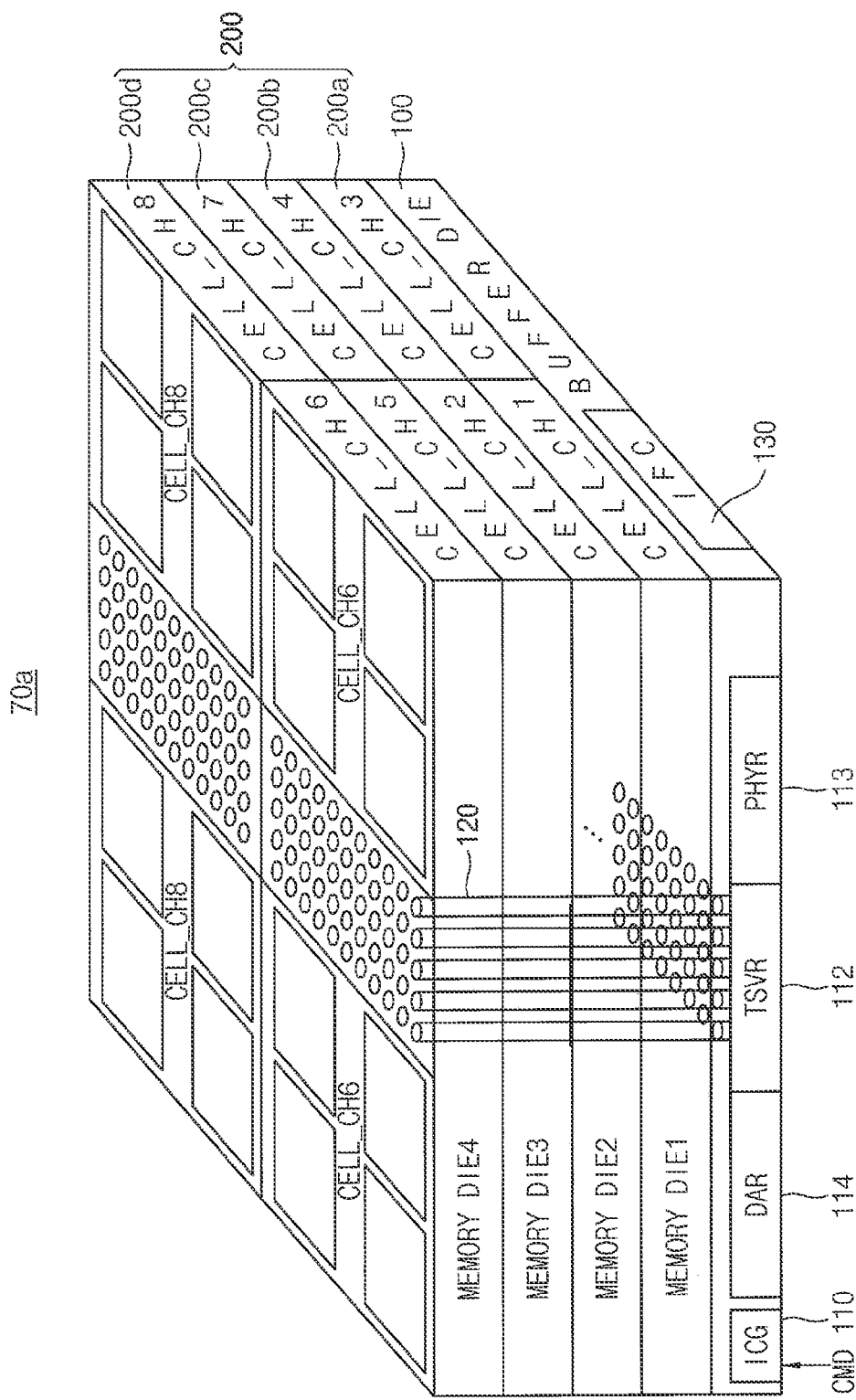
FIG. 5 is a block diagram illustrating an example of the stacked memory device in FIG. 2 according to exemplary embodiments.

FIG. 5 is a block diagram illustrating an example of the stacked memory device in FIG. 2 according to exemplary embodiments.

In FIG. 5, a memory device in a high bandwidth memory (HBM) form having an increased bandwidth by including a plurality of independent channels having independent interfaces as illustrated.

Referring to FIG. 5, a stacked memory device 70*a* may include a plurality of layers. For example, the stacked memory device 70*a* may include the buffer die 100 and one or more memory dies 200 which are stacked on buffer die 100. In the example of FIG. 5, although first to fourth memory dies 200*a*~200*d* are illustrated as being provided, the number of the core dies may be variously changed and is not limited thereto.

Further, each of the memory dies 200 may include one or more channels. A single memory die includes two channels in the example of FIG. 5, and thus an example in which the stacked memory device 70*a* has eight channels CH1 to CH8 is illustrated.

For example, a first memory die 200*a* may include a first channel CH1 and a third channel CH3, a second memory die 200*b* may include a second channel CH2 and a fourth channel CH4, a third memory die 200*c* may include a fifth memory channel CH5 and a seventh channel CH7, and a fourth memory die 200*d* may include a sixth channel CH6 and an eighth channel CH8.

The buffer die 100 may communicate with the memory controller (an external device), receive a command, an address, and data from the memory controller, and provide the received command, address, and data to the memory dies 200. The buffer die 100 may communicate with the memory controller through a conductive means (not illustrated) such as bumps and the like which are formed on an outer surface thereof. The buffer die 100 may buffer the command, the address, and the data, and thus the memory controller may interface with the memory dies 200 by driving only a load of the buffer die 100.

Further, the stacked memory device 70*a* may include a plurality of TSVs 120 passing through the layers.

The TSVs 120 may be disposed corresponding to the plurality of channels CH1 to CH8, may be disposed to pass through the first to fourth memory dies 200*a* to 200*d*, and each of the first to fourth memory dies 200*a* to 200*d* may include a transmitter/a receiver connected to the TSVs 120. When a normal operation in which the inputting and outputting of the data is independently performed for each channel, only the transmitter/receiver of any one core die may be enabled, with respect to each of the TSVs 120, and thus each of the TSVs 120 may independently deliver only the data of any one memory die, or any channel, as an independent channel for that one memory die or channel.

The buffer die 100 may include an internal command generator 110, the interface circuit 130, a TSV region TSVR 112, a physical region PHYR 113 and a direct access region DAR 114. The internal command generator 110 may generate an internal command based on the command CMD.

The TSV region 112 is a region in which TSVs 120 for communicating with the memory dies 200 are formed. Further, the physical region 113 is a region including a plurality of input-and-output (JO) circuits for communicating with an external memory controller, and various types of signals from the memory controller may be provided to the TSV region 112 through the physical region 113 and to the memory dies 200 through the TSVs 120.

The direct access region 114 may directly communicate with an external test device in a test mode for the stacked memory device 70a through a conductive means which is disposed on an outer surface of the stacked memory device 70a. Various types of signals provided from the tester may be provided to the memory dies 200 through the direct access region 114 and the TSV region 112.

The interface circuit 130 may provide the address and the data from the external device to a target memory die (i.e., one of the memory die) and may provide the external device with a main data form the target memory die. In addition, the interface circuit 130 may provide the external device with a decision signal associated with a test from the target memory die.

Figure 6:
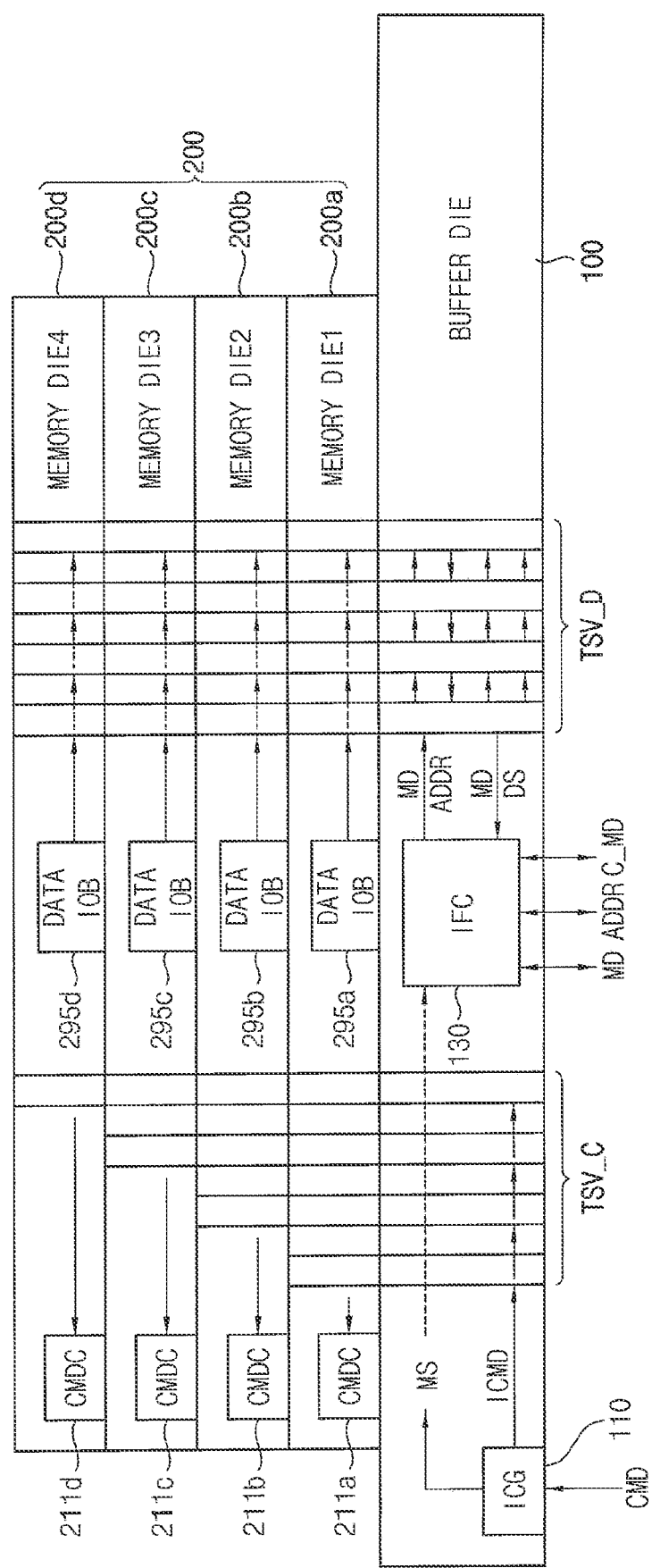
FIG. 6 illustrates operation of the interface circuit in the stacked memory device of FIG. 5.

FIG. 6 illustrates operation of the interface circuit in the stacked memory device of FIG. 5.

Referring to FIGS. 5 and 6, the buffer die 100 includes the internal command generator 110 and the interface circuit 130. Internal commands ICMD from the internal command generator 110 are provided to the memory dies 200 through command TSVs TSV_C which are independently formed for each channel. The internal command generator 110 may provide the interface circuit 130 with a mode signal MS designating one of a plurality of operation modes based on the command CMD.

The interface circuit 130 may provide the main data MD to a corresponding memory die through data TSVs TSV_D which are commonly formed for each channel in a write operation in response to the mode signal MS.

The interface circuit 130 may provide the external device with the main data MD provided from the target memory die through data TSVs TSV_D in a read operation in response to the mode signal MS. In addition, the interface circuit 130, in a test mode, may provide the external device with a decision signal DS from the target memory die.

Each of the memory dies 200a to 200d may respectively include command decoders 211a to 211d which output internal control signals by decoding internal commands, and data input/output buffer (IOB) 295a to 295d which provide/receive data to/from the data TSVs TSV_D.

Referring to one of the memory dies 200a to 200d (for example, the first memory die 200a), the first memory die 200a may perform a memory operation according to a decoding result of command decoder 211a, and for example, data of a plurality of bits stored in a memory cell region inside the first memory die 200a may be read and provided to the data I/O buffer 295a. The data I/O buffer 295a may process the data of the plurality of bits in parallel, and output the data processed in parallel to a plurality of data TSVs TSV_D in parallel.

Figure 7:
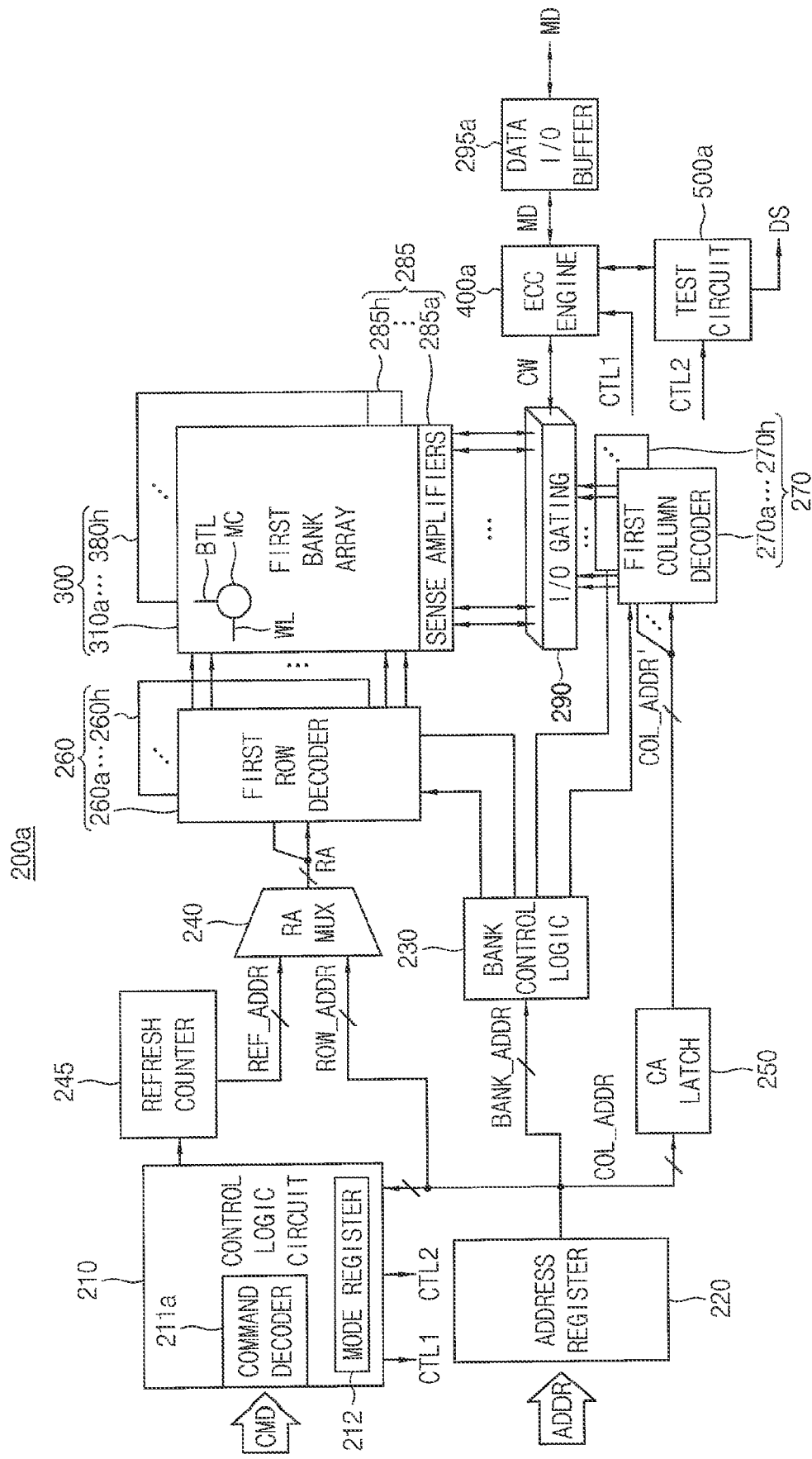
FIG. 7 is a block diagram illustrating an example of one of the memory dies in the stacked memory device in FIG. 6 according to exemplary embodiments.

FIG. 7 is a block diagram illustrating an example of one of the memory dies in the stacked memory device in FIG. 6 according to exemplary embodiments.

In FIG. 7, a configuration of the memory die 200a is illustrated, and each configuration of the plurality of memory dies 200b~200d may be substantially the same as the configuration of the memory die 200a.

Referring to FIG. 7, the memory die 200a may include a control logic circuit 210, an address register 220, a bank control logic 230, a row address multiplexer 240, a column address latch 250, a row decoder 260, a column decoder 270, a memory cell array 300, a sense amplifier unit 285, an input/output (I/O) gating circuit 290, an ECC engine 400a, a test circuit 500a, a data input/output (I/O) buffer 295a and a refresh counter 245.

The memory cell array 300 may include first through eighth bank arrays 310, 320, 330, 340, 350, 360, 370 and 380.

The row decoder 260 may include first through eighth row decoders 260a~260h coupled to the first through eighth bank arrays 310-380, respectively, the column decoder 270 may include first through eighth column decoders 270a~270h coupled to the first through eighth bank arrays 310-380, respectively, and the sense amplifier unit 285 may include first through eighth sense amplifiers 285a-285h coupled to the first through eighth bank arrays 310-380, respectively.

The first through eighth bank arrays 310-380, the first through eighth row decoders 260a-260h, the first through eighth column decoders 270a-270h, and the first through eighth sense amplifiers 285a-285h may form first through eighth banks. Each of the first through eighth bank arrays 310-380 may include a plurality of word-lines WL, a plurality of bit-lines BL, and a plurality of memory cells MC formed at intersections of the word-lines WL and the bit-lines BTL.

Although the memory die 200a is illustrated in FIG. 7 as including eight banks, the memory die 200a may include any number of banks and is not limited thereto.

The address register 220 may receive the address ADDR including a bank address BANK_ADDR, a row address ROW_ADDR, and a column address COL_ADDR from the memory controller 20. The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through eighth bank row decoders 260a~260h corresponding to the bank address BANK_ADDR may be activated in response to the bank control signals, and one of the first through eighth bank column decoders 270a~270h corresponding to the bank address BANK_ADDR may be activated in response to the bank control signals.

The row address multiplexer 240 may receive the row address ROW_ADDR from the address register 220, and may receive a refresh row address REF_ADDR from the refresh counter 245. The row address multiplexer 240 may selectively output the row address ROW_ADDR or the refresh row address REF_ADDR as a row address RA. The row address RA that is output from the row address multiplexer 240 may be applied to the first through eighth bank row decoders 260a-260h.

The activated one of the first through eighth row decoders 260a-260h may decode the row address RA that is output from the row address multiplexer 240, and may activate a word-line WL corresponding to the row address RA. For example, the activated row decoder may generate a word-line driving voltage and may apply the word-line driving voltage to the word-line WL corresponding to the row address RA.

The column address latch 250 may receive the column address COL_ADDR from the address register 220, and may temporarily store the received column address COL_ADDR. In exemplary embodiments, in a burst mode, the column address latch 250 may generate column addresses COL_ADDR' that increment from the received column address COL_ADDR. The column address latch 250 may apply the temporarily stored or generated column address COL_ADDR' to the first through eighth column decoders 270a-270h.

The activated one of the first through eighth column decoders 270a-270h may decode the column address COL_ADDR' that is output from the column address latch 250, and may control the I/O gating circuit 290 to output data corresponding to the column address COL_ADDR'.

The I/O gating circuit 290 may include circuitry for gating input/output data. The I/O gating circuit 290 may further include read data latches for storing data that is output from the first through eighth bank arrays 310-380, and write control devices for writing data to the first through eighth bank arrays 310-380.

Codeword CW read from one of the first through eighth bank arrays 310-380 may be sensed by a sense amplifier coupled to the one bank array from which data is to be read, and may be stored in the read data latches.

The codeword CW stored in the read data latches may be provided to the ECC engine 400a. The ECC engine 400a may perform the RS decoding on the codeword CW to correct an error by unit of symbol and may provide the memory controller 20 with a corrected main data MD through the data I/O buffer 295a.

The main data MD to be stored in one of the first through eighth bank arrays 310~380 may be provided to the data I/O buffer 295a from the memory controller 20. The data I/O buffer 295a provides the main data MD to the ECC engine 400a. The ECC engine 400a performs a RS encoding on the main data MD to generate parity data and provide the I/O gating circuit 290 with the codeword CW including the main data MD and the parity data.

The test circuit 500a, in the test mode, may generate a test syndrome and an expected decoding status flag indicating error status of the test syndrome, may provide the test syndrome to the ECC engine 400a, may receive test parity data generated by the ECC engine 400a based on the test syndrome and a decoding status flag indicating error status of the test parity data and may determine whether the ECC engine 400a has a defect based on a comparison of the test syndrome and the test parity data and comparison of the expected decoding status flag and the decoding status flag.

The control logic circuit 210 may control operations of the memory die 200a. For example, the control logic circuit 210 may generate control signals for the memory die 200a to perform the write operation or the read operation. The control logic circuit 210 may generate control signals for the memory die 200a to perform a test operation.

The control logic circuit 210 may include a command decoder 211a that decodes the command CMD received from the memory controller 20 and a mode register 212 that sets an operation mode of the memory die 200a. The control logic circuit 210 may generate a first control signal CTL1 to control the ECC engine 400a and may generate a second control signal CTL2 to control the test circuit 500a.

Figure 8:
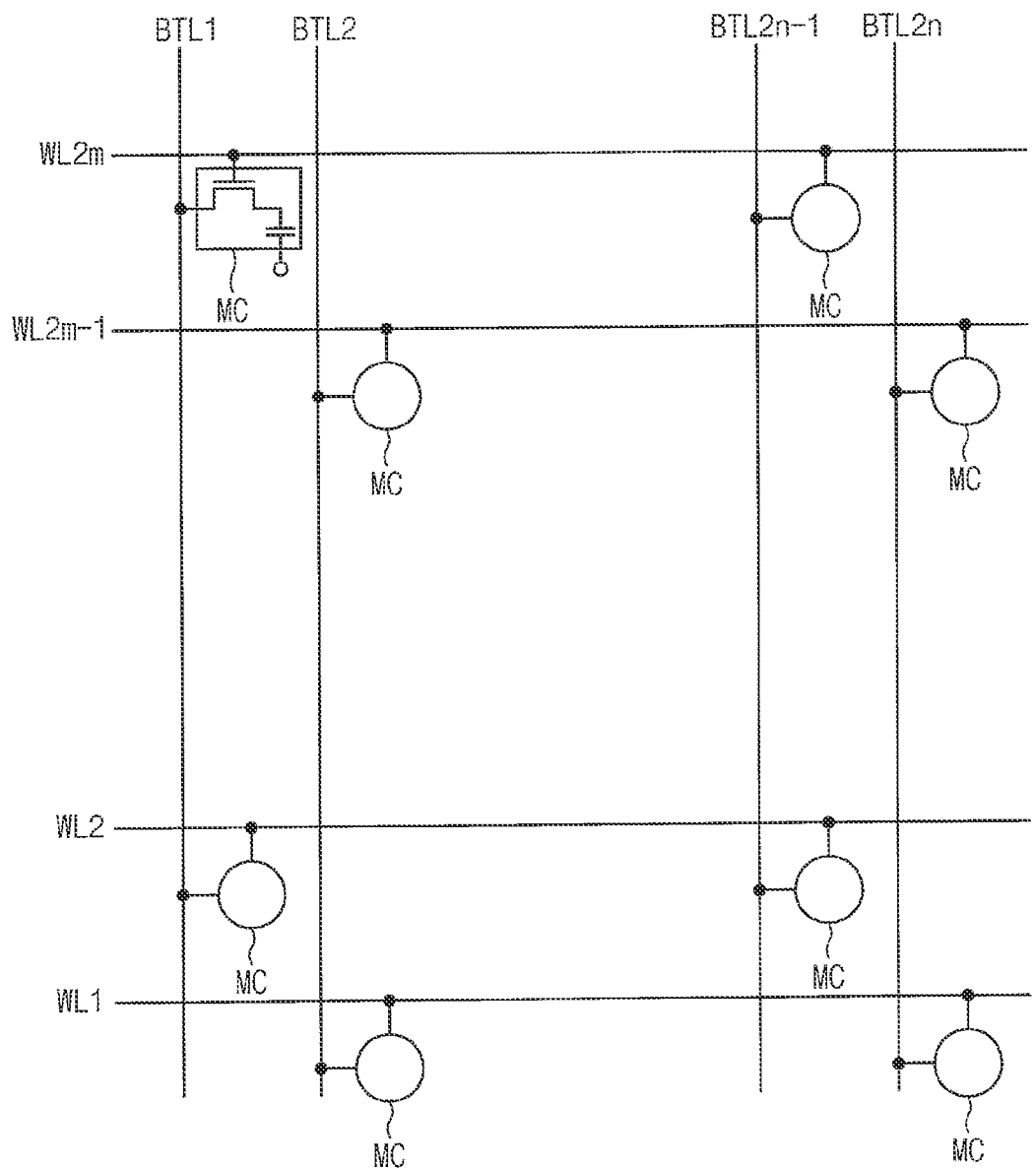
FIG. 8 illustrates a first bank array in the memory die of FIG. 7 according to exemplary embodiments.

FIG. 8 illustrates a first bank array in the memory die of FIG. 7 according to exemplary embodiments.

Referring to FIG. 8, the first bank array 310 includes a plurality of word-lines WL1~WL2m (where m is a natural number greater than two), a plurality of bit-lines BTL1~BTL2n (where n is a natural number greater than two), and a plurality of memory cells MCs disposed near intersections between the word-lines WL1~WL2m and the bit-lines BTL1~BTL2n. In an exemplary embodiment of the inventive concept, each of the plurality of memory cells MCs may include a DRAM cell structure. The plurality of word-lines WL1~WL2m to which the plurality of memory cells MCs are connected may be referred to as rows of the first bank array 310 and the plurality of bit-lines BL1~BL2n to which the plurality of memory cells MCs are connected may be referred to as columns of the first bank array 310.

Figure 9:
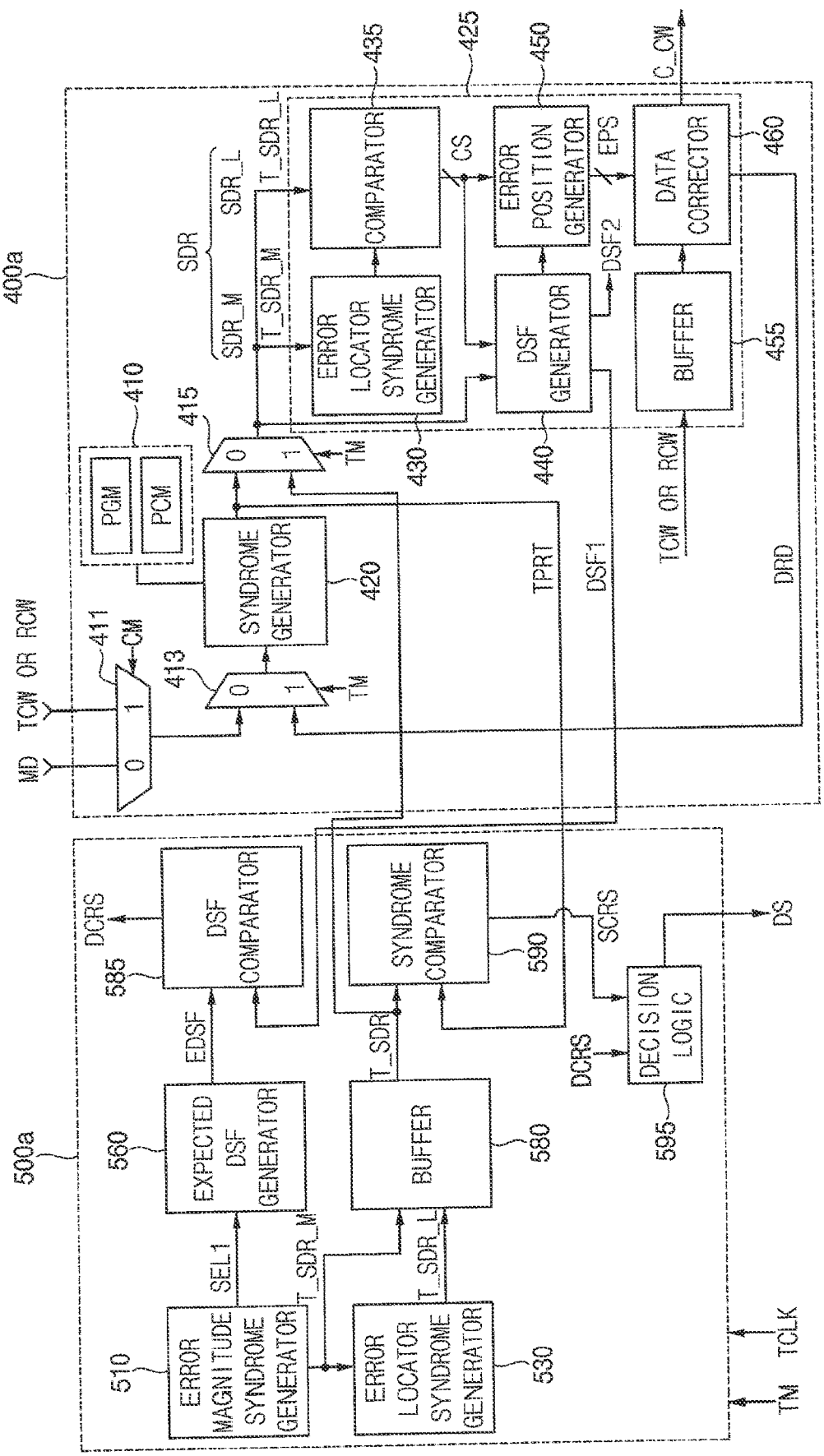
FIG. 9 illustrates the ECC engine and the test circuit in the memory die of FIG. 7 according to exemplary embodiments.

FIG. 9 illustrates the ECC engine and the test circuit in the memory die of FIG. 7 according to exemplary embodiments.

Referring to FIG. 9, the ECC engine 400a may include a memory 410, a first multiplexer 411, a second multiplexer 413, a third multiplexer 415 and a RS decoder 425 and the test circuit 500a may include an error magnitude syndrome generator 510, an error locator syndrome generator 530, an expected decoding status flag (DSF) generator 560, a buffer 580, a decoding status flag (DSF) comparator 585, a syndrome comparator 590 and decision logic 595.

The test circuit 500a may operate based on a test mode signal TM and a test clock signal TCLK.

The test circuit 500a, in the test mode, may generate a test syndrome T_SDR and an expected decoding status flag EDSF indicating error status of the test syndrome T_SDR, may provide the test syndrome T_SDR to the ECC engine 400a, may receive a test parity data TPRT generated by the ECC engine 400a based on the test syndrome T_SDR and a decoding status flag DSF1 indicating error status of the test parity data TPRT and may determine whether the ECC engine 400a has a defect based on comparison of the test syndrome T_SDR and the test parity data TPRT and comparison of the expected decoding status flag EDSF and the decoding status flag DSF1.

The error magnitude syndrome generator 510, in the test mode, may output a test error magnitude syndrome T_SDR_M indicating a number of errors in the test syndrome, associated with the selected error pattern selected from a plurality of error patterns and a first selection signal SEL1 associated with a selected error pattern.

The error locator syndrome generator 530 may generate a test error locator syndrome T_SDR_L indicating a position of a symbol including the error by multiplying the test error magnitude syndrome T_SDR_M by an alpha matrix corresponding to the error in the test syndrome.

The expected DSF generator 560 may select one of a plurality of expected decoding status flags in response to the first selection signal SEL1 to output the expected decoding status flag EDSF corresponding to the selected error pattern.

The DSF comparator 585 may compare the expected decoding status flag EDSF with the decoding status flag DSF1 to output a first comparison result signal DCRS indicating whether the expected decoding status flag EDSF matches the decoding status flag DSF1.

The buffer 5802 may receive the test error magnitude syndrome T_SDR_M and the test error locator syndrome T_SDR_L and may provide the ECC engine 400a with a test syndrome T_SDR including the test error magnitude syndrome T_SDR_M and the test error locator syndrome T_SDR_L.

The syndrome comparator 590 may compare the test syndrome T_SDR and the test parity data TPRT to output a second comparison result signal SCRS indicating whether the test syndrome T_SDR matches the test parity data TPRT.

The decision logic 595 may output a decision signal DS indicating whether the ECC engine 400a has a (hardware) defect based on the first comparison result signal DCRS and the second comparison result signal SCRS.

The decision logic 595 may indicate that the ECC engine 400a has a defect using the decision signal DS when the first comparison result signal DCRS indicates that the expected decoding status flag EDSF does not match the decoding status flag DSF1 or when the second comparison result signal SCRS indicates that the test syndrome T_SDR does not match the test parity data TPRT.

The first multiplexer 411, in response to a coding mode signal CM designating an encoding operation and a decoding operation, may select the main data MD in the encoding operation, may select a read codeword RCW in the decoding operation of a normal mode and may select a test codeword TCW in the decoding operation of the test mode.

The second multiplexer 413, in response to the test mode signal TM, may select an output of the first multiplexer 411 to provide a selected output to the syndrome generator 420 in the normal mode and may select a decoding result data DRD from the RS decoder 425 to provide selected data to the syndrome generator 420 in the test mode.

The memory 410 may store a parity generation matrix PGM and a parity check matrix PCM.

The syndrome generator 420 may generate a parity data based on the parity generation matrix PGM and an output of the second multiplexer 413 in the encoding operation and may generate a syndrome based on the parity check matrix PCM and the output of the second multiplexer 413 in the decoding operation.

The second multiplexer 415, in response to the test mode signal TM, may select the test syndrome T_SDR of an output of the syndrome generator 420 and the test syndrome T_SDR to provide the test syndrome T_SDR to the RS decoder 425 in the test mode and may select the output of the syndrome generator 420 to provide the output of the syndrome generator 420 to the RS decoder 425.

The RS decoder 425 may include an error locator syndrome generator 430, a comparator 435, a decoding status flag (DSF) generator 440, an error positon generator 450, a buffer 455 and a data corrector 460.

The error locator syndrome generator 430 may generate a comparative test error locator syndrome indicating a position of an error by multiplying the test error magnitude syndrome T_SDR_M indicating a number of errors in the test syndrome T_SDR by an alpha matrix corresponding to the error in the test syndrome T_SDR.

The comparator 435, in the test mode, may output a comparison signal CS by comparing the test error locator syndrome T_SDR_L indicating the position of the error in the test syndrome T_SDR with the comparative test error locator syndrome. The comparison signal CS may indicate that the test error locator syndrome T_SDR_L matches the comparative test error locator syndrome. When the test syndrome T_SDR includes no errors, the test error locator syndrome T_SDR_L matches the comparative test error locator syndrome. When the test syndrome T_SDR includes at least one error, the test error locator syndrome T_SDR_L does not match the comparative test error locator syndrome.

The DSF generator 440, in the test mode, may generate the decoding status flag generator DSF1 indicating error status of the test syndrome T_SDR based on the test syndrome T_SDR and the comparison signal CS and may provide the decoding status flag generator DSF1 to the DSF comparator 585 in the test circuit 500a.

The error positon generator 450, in the test mode, may generate an error position signal EPS indicating the positon of the error based on the comparison signal CS.

The buffer 455 may store the test codeword TCW corresponding to a zero codeword in the test mode and may provide the test codeword TCW to the data corrector 460.

The data corrector 460, in the test mode, may generate the decoding result data DRD by performing an exclusive OR operation on the error position signal EPS and the test codeword TCW corresponding to a zero codeword and may provide the decoding result data DRD to the second multiplexer 413. Therefore, the decoding result data DRD may be same as the error position signal EPS in the test mode.

The second multiplexer 413, in the test mode, may provide the decoding result data DRD to the syndrome generator 420 in response to the test mode signal TM.

The syndrome generator 420 may generate the test parity data TPRT by performing an RS encoding on the decoding result data DRD corresponding to the error position signal EPS by using the parity generation matrix PGM and may provide the test parity data TPRT to the syndrome generator 590 in the test circuit 500a.

The first multiplexer 411, in the encoding operation of the normal mode, may select the read codeword RCW, and the second multiplexer 413 may select the output of the first multiplexer 413.

The syndrome generator 420 may generate the syndrome SDR based on the parity check matrix PCM and the read codeword RCW and may provide the syndrome SDR to the RS decoder 425. The syndrome SDR may include an error magnitude syndrome SDR_M and an error locator syndrome SDR_L.

The RS decoder 425 may correct an error of the read codeword RCW by unit of symbol based on the syndrome SDR to output a corrected codeword C_CW.

The error locator syndrome generator 430, in the normal mode, may generate a comparative error locator syndrome indicating a position of an error by multiplying the error magnitude syndrome SDR_M, from the third multiplexer 415, indicating a number of errors in the syndrome SDR by an alpha matrix corresponding to the error in the syndrome SDR.

The comparator 435, in the normal mode, may output the comparison signal CS by comparing the error locator syndrome SDR_L indicating a position of the error in the syndrome DR with the comparative error locator syndrome. The comparison signal CS may indicate that the error locator syndrome SDR_L matches the comparative error locator syndrome. When a symbol includes a correctable error, the error locator syndrome SDR_L matches the comparative error locator syndrome and an error locator syndrome associated with a symbol including no error does not match the comparative error locator syndrome. When a symbol includes uncorrectable errors, each of the error locator syndromes associated with all symbols do not match the comparative error locator syndrome.

The DSF generator 440, in the normal mode, may generate a decoding status flag generator DSF2 indicating error status of the read codeword RCW based on the syndrome SDR and the comparison signal CS and may provide the decoding status flag generator DSF2 to the control logic circuit 210 or the external device.

The error positon generator 450, in the normal mode, may generate the error position signal EPS indicating a positon of the error in the read codeword RCW based on the comparison signal CS.

The buffer 455 may store the read codeword RCW in the normal mode and may provide the read codeword RCW to the data corrector 460.

The data corrector 460, in the normal mode, may correct an error in the read codeword RCW based on the error position signal EPS to output the corrected codeword C_CW.

Figure 10:
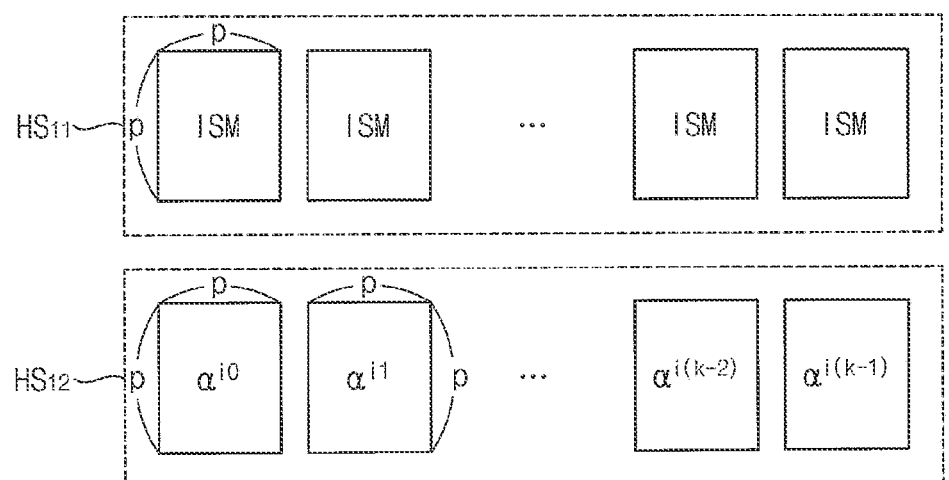
FIG. 10 illustrates a parity generation matrix stored in the memory in the ECC engine of FIG. 9.

FIG. 10 illustrates a parity generation matrix stored in the memory in the ECC engine of FIG. 9.

Referring to FIG. 10, the parity generation matrix PGM may include a first parity sub matrix $HS_{11}$ and a second parity sub matrix $HS_{12}$.

The first parity sub matrix $H_{11}$ includes a plurality of unit sub matrixes ISM corresponding to k (k is a natural number greater than one) symbols in one codeword. Each of the plurality of unit sub matrixes ISM includes p×p elements (p is a natural number greater than one).

The second parity sub matrix $HS_{12}$ includes a plurality of alpha matrixes $\alpha^{i0}, \alpha^{i1}, \ldots, \alpha^{i(k-2)}, \alpha^{i(k-1)}$ corresponding to k symbols in one codeword. The alpha matrix $\alpha^{i0}$ may be obtained based on a p-order primitive polynomial. The alpha matrix $\alpha^{i1}$ may be obtained by power of the alpha matrix $\alpha^{i0}$ and elements of the alpha matrixes may be generated based on RS code.

FIG. 11 illustrates a unit sub matrix in the parity generation matrix in FIG. 10.

Referring to FIG. 11, a unit sub matrix ISM includes p high level elements disposed in a diagonal direction. Each of other elements except the high level elements have a zero.

Figure 12:
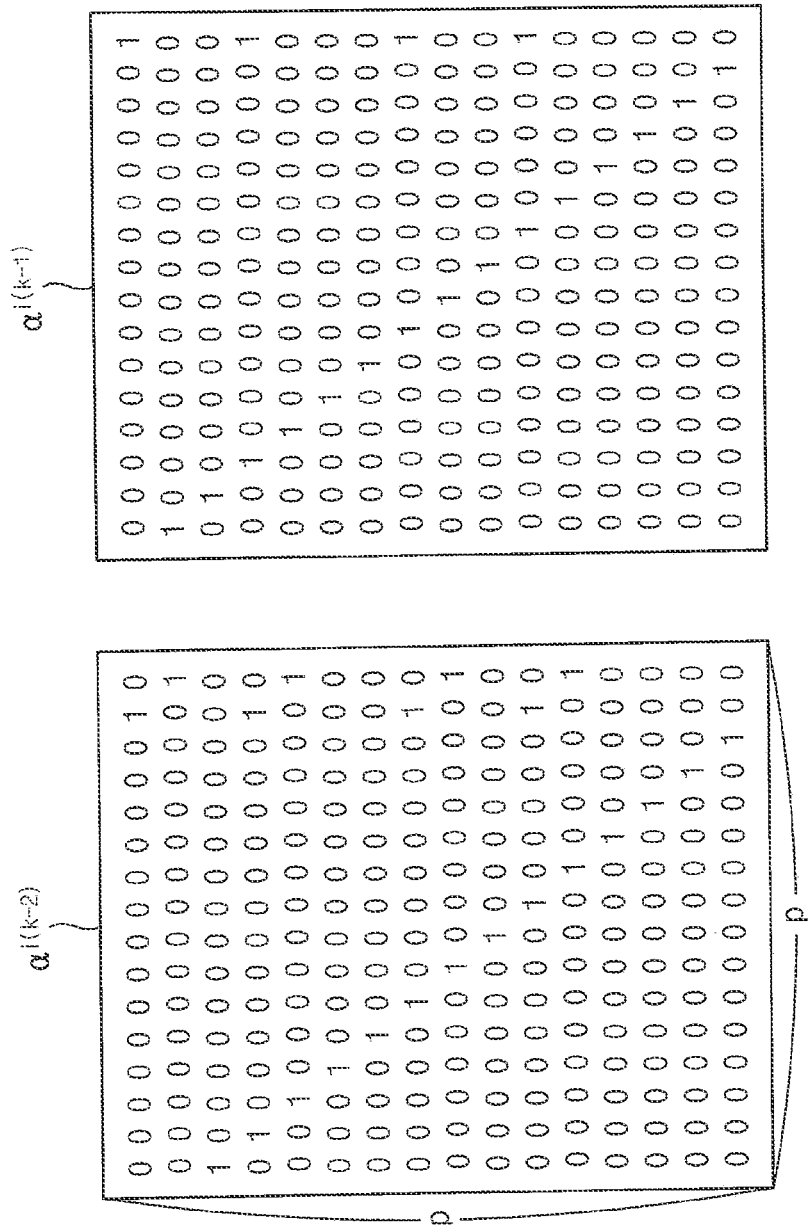
FIG. 12 illustrates alpha matrixes in the parity generation matrix in FIG. 10.

FIG. 12 illustrates alpha matrixes in the parity generation matrix in FIG. 10.

Referring to FIG. 12, The alpha matrix $\alpha^{i(k-1)}$ may be obtained by shifting alpha matrix $\alpha^{i(k-2)}$ in a right-hand direction.

In FIGS. 11 and 12, p corresponds to 16 and corresponds to a number of data bits in one symbol.

Figure 13:
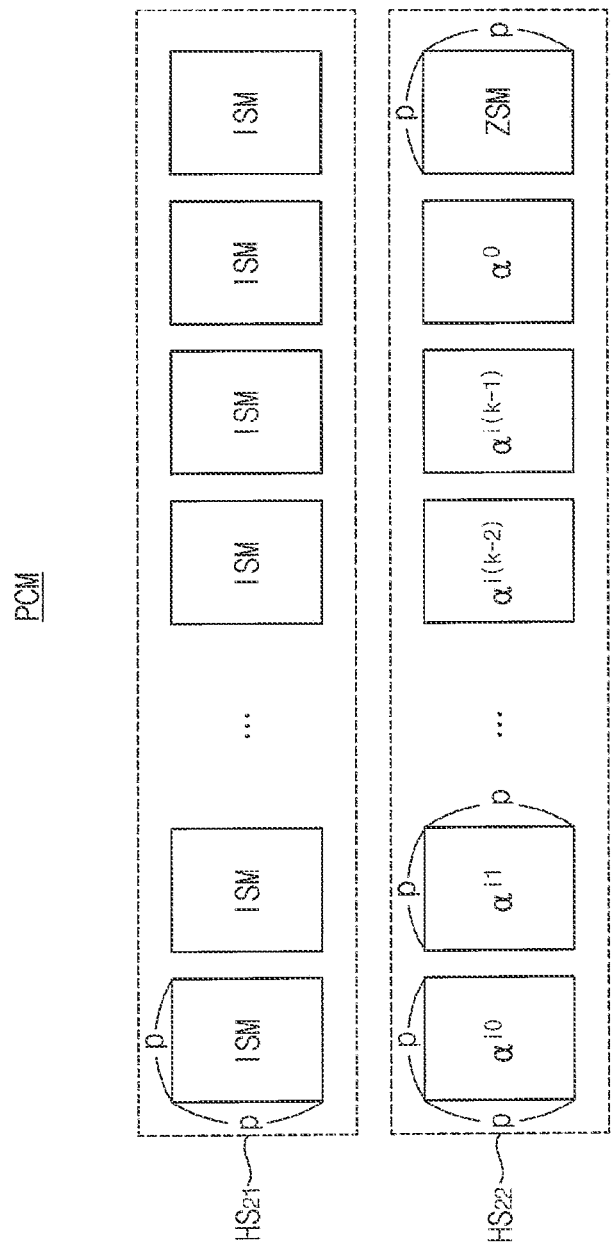
FIG. 13 illustrates a parity check matrix stored in the memory in the ECC engine of FIG. 9.

FIG. 13 illustrates a parity check matrix stored in the memory in the ECC engine of FIG. 9.

Referring to FIG. 13, the parity check matrix PCM may include a first parity sub matrix $HS_{21}$ and a second parity sub matrix $HS_{22}$.

The first parity sub matrix $HS_{21}$ includes a plurality of unit sub matrixes ISM corresponding to k symbols in one codeword, and two unit sub matrixes ISM corresponding to the error magnitude syndrome and the error locator syndrome. Each of the plurality of unit sub matrixes ISM includes p×p elements.

The second parity sub matrix $HS_{22}$ includes a plurality of alpha matrixes $\alpha^{i0}, \alpha^{i1} \ldots, \alpha^{i(k-2)}$ and $\alpha^{i(k-1)}$ corresponding to k symbols in one codeword, an alpha matrix $\alpha^0$ (=ISM) corresponding to the error magnitude syndrome and a zero sub matrix ZSM corresponding to the error locator syndrome. The zero sub matrix ZSM includes p×p elements.

FIG. 14 illustrates a zero sub matrix in the parity check matrix in FIG. 13.

Referring to FIG. 14, in a zero sub matrix ZSM, each of p×p elements has a zero.

Figure 15:
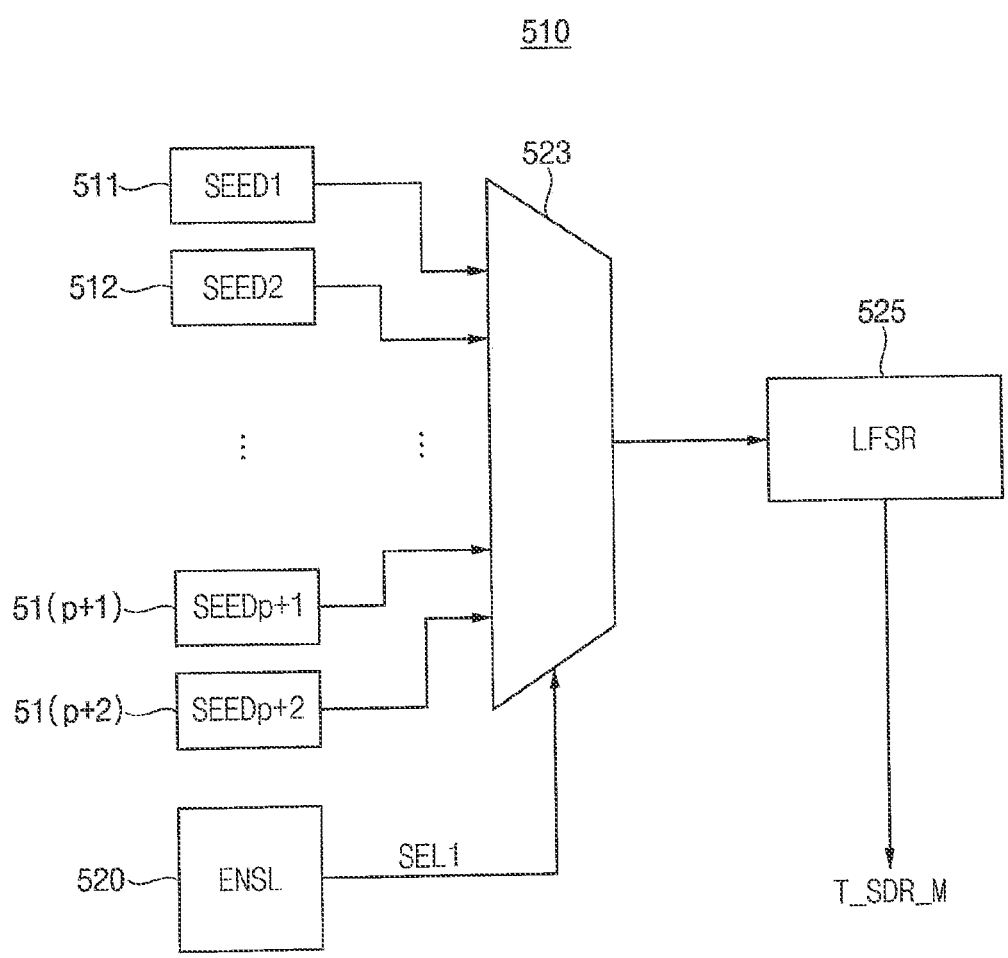
FIG. 15 illustrates an example of the error magnitude syndrome generator in the test circuit in FIG. 9 according to exemplary embodiments.

FIG. 15 illustrates an example of the error magnitude syndrome generator in the test circuit in FIG. 9 according to exemplary embodiments.

Referring to FIG. 15, the error magnitude syndrome generator 510 may include a plurality of registers 511, 512, ..., 51(p+1) and 51(p+2), an error number selection logic (ENSL), a multiplexer 523 and a linear feedback shift register (LFSR) 525.

Each of the plurality of registers 511, 512, ..., 51(p+1) and 51(p+2) may store respective one of a plurality of seeds SEED1, SEED2, ..., SEED(p+1) and SEED(p+2) corresponding to a plurality of error patterns. The seed SEED1 may correspond to an error pattern including no error in one symbol, the seed SEED2 may correspond to an error pattern including one error in one symbol, the seed SEED(p+1) may correspond to an error pattern including errors corresponding to a size of one symbol and the seed SEED(p+1) may correspond to an error pattern including errors exceeding error correction capability of the ECC engine 400a.

The ENSL 520, in the test mode, may generate the first selection signal SEL1 for selecting the plurality of seeds SEED1, SEED2, ..., SEED(p+1) and SEED(p+2) sequentially and may provide the first selection signal SEL1 to the multiplexer 523 and the expected DSF generator 582.

The multiplexer 523 may select one of the plurality of seeds SEED1, SEED2, ..., SEED(p+1) and SEED(p+2) and provide the selected one to the LFSR 525 and the LFSR 525 may generate the test error magnitude syndrome T_SDR_M using the selected seed as a seed.

The first selection signal SEL1 may have a value sequentially incremented or decremented, the multiplexer 523 may sequentially select the plurality of seeds SEED1, SEED2, ..., SEED(p+1) and SEED(p+2) to provide the selected seed to the LFSR 525 and the LFSR 525 may sequentially output the test error magnitude syndrome T_SDR_M corresponding to a plurality of error patterns.

In exemplary embodiments, a barrel shifter or a counter may output the test error magnitude syndrome T_SDR_M in response to a selected one from among the plurality of seeds SEED1, SEED2, ..., SEED(p+1) and SEED(p+2) instead of the LFSR 525.

Figure 16:
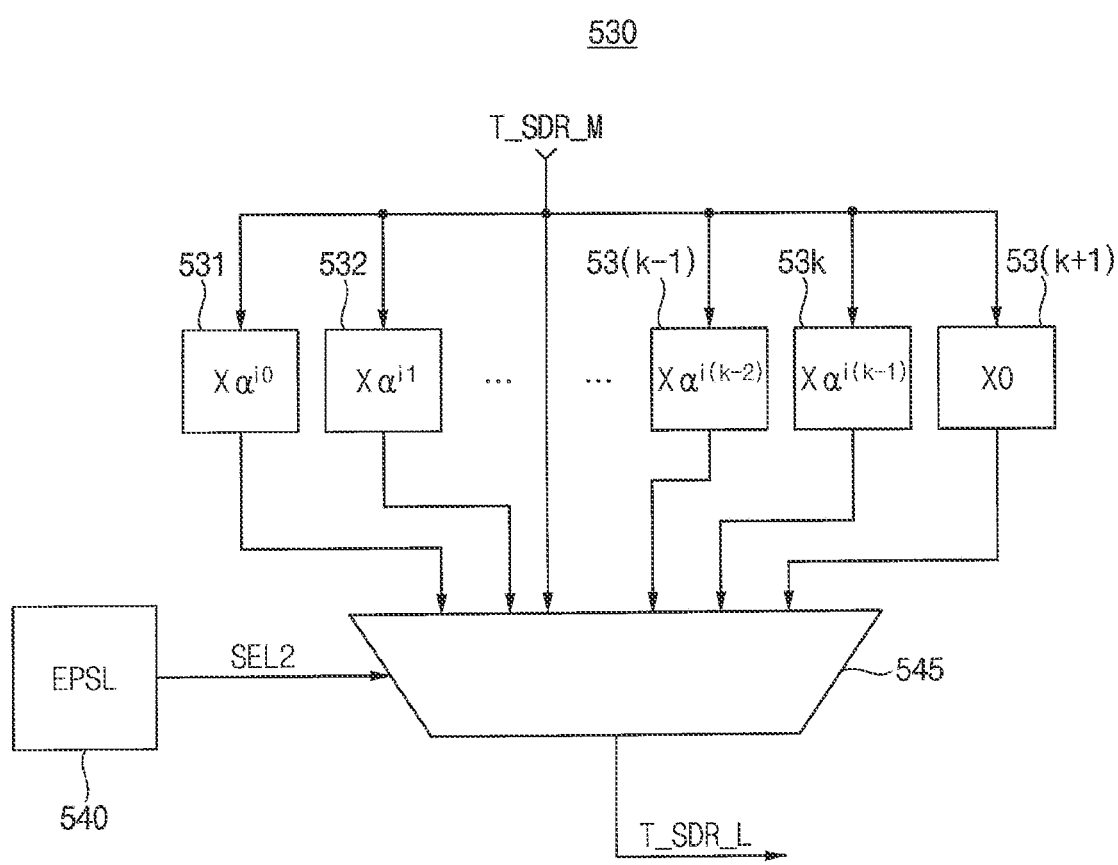
FIG. 16 illustrates an example of the error locator syndrome generator in the test circuit in FIG. 9 according to exemplary embodiments.

FIG. 16 illustrates an example of the error locator syndrome generator in the test circuit in FIG. 9 according to exemplary embodiments.

Referring to FIG. 16, the error locator syndrome generator 530 may include a plurality of multipliers 531, 532, ... 53(k−1), 53k and 51(k+1), an error position selection logic (EPSL) 540 and a multiplexer 545.

Each of the plurality of multipliers 531, 532, ... 53(k−1), 53k and 51(k+1) may multiply the test error magnitude syndrome T_SDR_M by a respective one of the of alpha matrixes $\alpha^{i0}, \alpha^{i1}, \ldots, \alpha^{i(k-2)}, \alpha^{i(k-1)}$ and the zero sub matrix ZSM to provide the multiplexer 545 with a result of each multiplication. In addition, the test error magnitude syndrome T_SDR_M may be provided to the multiplexer 545.

The EPSL 540, in the test mode, generates a second selection signal SEL2 designating a position of a symbol including the error and may provide the second selection signal SEL2 to the multiplexer 545.

The multiplexer 545 may select one of the results of each multiplications from the plurality of multipliers 531, 532, ... 53(k−1), 53k and 51(k+1) and the test error magnitude syndrome T_SDR_M and may output a selected one as the test error locator syndrome T_SDR_L.

Figure 17:
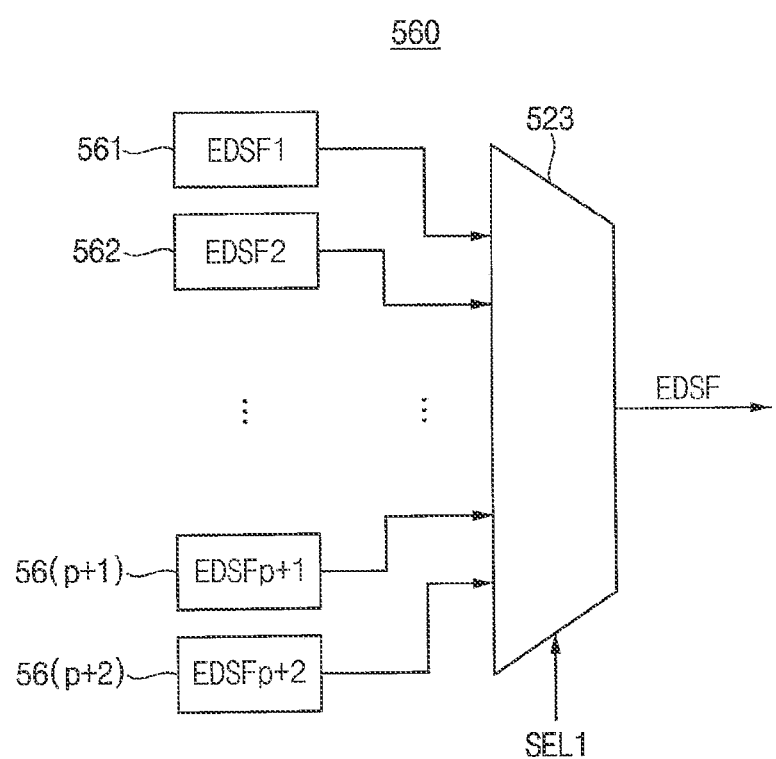
FIG. 17 illustrates an example of the expected DSF generator in the test circuit in FIG. 9 according to exemplary embodiments.

FIG. 17 illustrates an example of the expected DSF generator in the test circuit in FIG. 9 according to exemplary embodiments.

Referring to FIG. 17, the expected DSF generator 560 may include a plurality of registers 561, 562, ..., 56(p+1) and a multiplexer 570.

Each of the plurality of registers 561, 562, ... 56(p+1) may store respective one of a plurality of expected decoding status flags EDSF1, EDSF2, ..., EDSF(p+1) and EDSF(p+2) corresponding to a plurality of error patterns. The expected decoding status flag EDSF1 may correspond to an error pattern including no error in one symbol, the expected decoding status flag EDSF2 may correspond to an error pattern including one error in one symbol, the expected decoding status flag EDSF(p+1) may correspond to an error pattern including errors corresponding to a size of one symbol and the expected decoding status flag EDSF(p+1) may correspond to an error pattern including errors exceeding error correction capability of the ECC engine 400a.

The multiplexer 570 may select one of the plurality of expected decoding status flags EDSF1, EDSF2, ..., EDSF(p+1) and EDSF(p+2) and output a selected one as the expected decoding status flag EDSF.

Figures 18, 19:
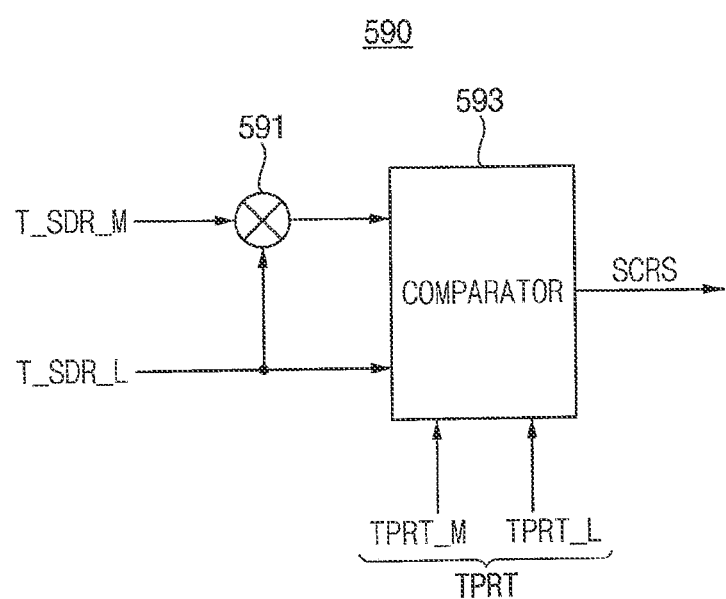
FIG. 18 illustrates an example of the syndrome comparator in the test circuit in FIG. 9 according to exemplary embodiments.
FIG. 19 illustrates that the test circuit generates the test error magnitude syndrome and the test error locator syndrome based on the parity check matrix.

FIG. 18 illustrates an example of the syndrome comparator in the test circuit in FIG. 9 according to exemplary embodiments.

Referring to FIG. 18, the syndrome comparator 590 may include an exclusive OR gate 591 and a comparator 593.

The exclusive OR gate 591 may perform an exclusive OR operation on the test error magnitude syndrome T_SDR_M and the test error locator syndrome T_SDR_L and provides a result of the exclusive OR operation to the comparator 593.

The comparator 593 may compare the result of the exclusive OR operation with a test error magnitude parity TPRT_M in the test parity data TPRT and may compare the test error locator syndrome T_SDR_L with a test error locator TPRT_L in the test parity data TPRT and may output the second comparison result signal SCRS based on the comparisons.

In exemplary embodiments, the syndrome comparator 590 may include the comparator 593 and may omit the exclusive OR gate 591. The comparator 593 may compare the test error magnitude syndrome T_SDR_M with the test error magnitude parity TPRT_M and may compare the test error locator syndrome T_SDR_L with a test error locator TPRT_L in the test parity data TPRT and may output the second comparison result signal SCRS based on the comparisons.

As mentioned with reference to FIGS. 15 through 18, the test circuit 500a may sequentially generate the test syndrome T_SDR and the expected decoding status flag EDSF with respect to a plurality of error patterns and may provide the test syndrome T_SDR to the ECC engine 400a. The test circuit 500a may determine whether the ECC engine 400a has a defect by comparing the test syndrome T_SDR with the test parity data TPRT generated by the ECC engine 400a based on the test syndrome T_SDR and by comparing the expected decoding status flag EDSF with the decoding status flag DSF1.

FIG. 19 illustrates how the test circuit generates the test error magnitude syndrome and the test error locator syndrome based on the parity check matrix.

Referring to FIG. 19, the test error magnitude syndrome T_SDR_M may be obtained by matrix multiplication of the first sub check matrix $HS_{21}$ of the parity check matrix of FIG. 13 and a transpose matrix $C^T$ of a vector representation C of the test codeword TCW. In addition, the test error locator syndrome T_SDR_L may be obtained by matrix multiplication of the second sub check matrix $HS_{22}$ of the parity check matrix of FIG. 13 and the transpose matrix $C^T$ of the vector representation C of the test codeword TCW.

As described with reference to FIG. 13, because the first sub check matrix $HS_{21}$ includes the plurality of unit sub matrixes ISM and the second sub check matrix $HS_{22}$ includes alpha matrixes $\alpha^{i0}, \alpha^{i1}, \ldots, \alpha^{i(k-2)}$ and $\alpha^{i(k-1)}$, unit sub matrix ISM and the zero sub matrix ZSM, the test error magnitude syndrome T_SDR_M may have different values based on a number of errors in the test codeword TCW and the test error locator syndrome T_SDR_L may represent a position of a symbol including errors in the test codeword TCW.

FIG. 20 illustrates an example of the test syndrome according to exemplary embodiments.

In FIG. 20, it is assumed that the test codeword TCW input the ECC engine 400a in FIG. 9 includes a plurality of symbols, each of the symbols includes 16 bits and one of the symbols includes an error. Each symbol, not including an error, in the test codeword TCW corresponds to '0000000000000000' and the symbol, including an error, in the test codeword TCW corresponds to '0000000000000001'.

Referring to FIG. 20, the test syndrome T_SDR includes the test error magnitude syndrome T_SDR_M and the test error locator syndrome T_SDR_L, the test error magnitude syndrome T_SDR_M is represented by '0000000000000000' associated with an error in one symbol and the test error locator syndrome T_SDR_L is represented by '1001000100100000' indicating a position of the symbol including the error.

Figure 21:
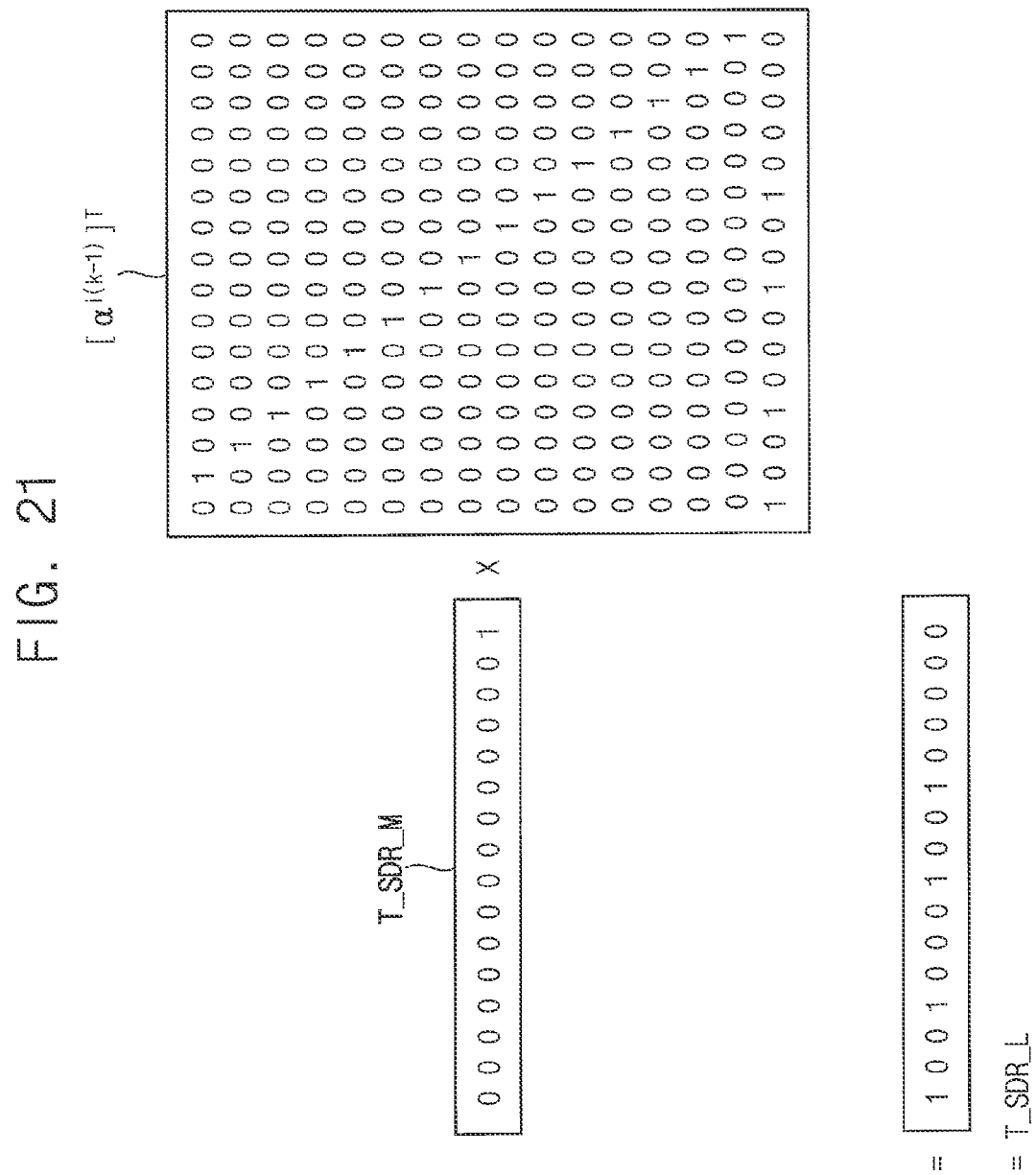
FIG. 21 illustrates that a result of multiplication of the test error magnitude syndrome and an alpha matrix corresponding to a symbol including the error.

FIG. 21 illustrates the result of multiplication of the test error magnitude syndrome and an alpha matrix corresponding to a symbol including the error.

Referring to FIG. 21, the result of multiplication of the test error magnitude syndrome T_SDR_M and a transpose matrix $(\alpha^{i(k-1)})^T$ of an alpha matrix $\alpha^{i(k-1)}$ corresponding to the symbol including the error is the same as the test error locator syndrome T_SDR_L.

That is, it is noted that an error occurs in a symbol corresponding to the alpha matrix $\alpha^{i(k-1)}$.

When a multiplication is performed on the test error magnitude syndrome T_SDR_M represented by '0000000000000000' and a transpose matrix $(\alpha^{i(k-2)})^T$ of an alpha matrix $\alpha^{i(k-2)}$ corresponding to the symbol including no errors, a result of the multiplication is '0100100010010000' which is not the same as the test error locator syndrome T_SDR_L.

Figure 22:
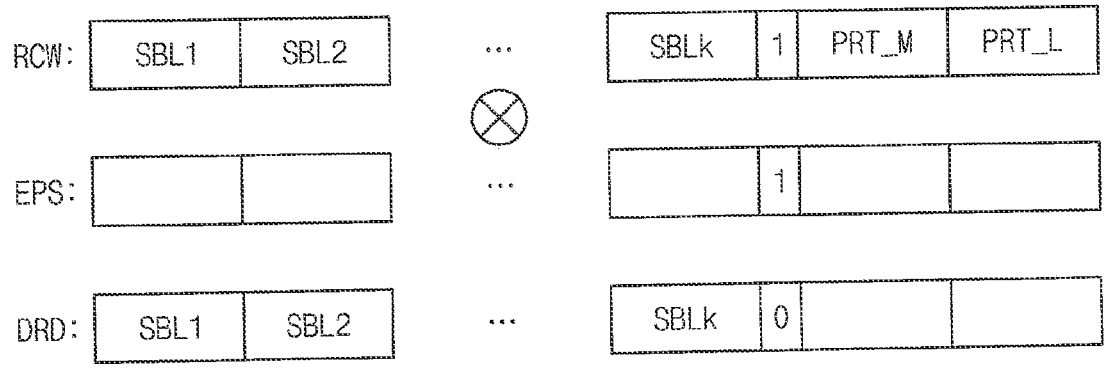
FIG. 22 illustrates that the ECC engine in FIG. 9 performs an RS decoding.

FIG. 22 illustrates that the ECC engine of FIG. 9 performs an RS decoding.

Referring to FIGS. 9 and 22, in the test mode, the syndrome T_SDR from the test circuit 500a is provided to the ECC engine 400a.

The error locator syndrome generator 430, in the test mode, may generate the comparative test error locator syndrome by multiplying the test error magnitude syndrome T_SDR_M in the test syndrome T_SDR by an alpha matrix corresponding to the error in the test syndrome T_SDR. The comparator 435, in the test mode, may output the comparison signal CS by comparing the test error locator syndrome T_SDR_L with the comparative test error locator syndrome. The comparison signal CS may indicate that the test error locator syndrome T_SDR_L matches the comparative test error locator syndrome.

The DSF generator 440, in the test mode, may generate the decoding status flag generator DSF1 indicating error status of the test syndrome T_SDR based on the test syndrome T_SDR. The error positon generator 450, in the test mode, may generate the error position signal EPS indicating a positon of the error based on the comparison signal CS.

The data corrector 460, in the test mode, may generate the decoding result data DRD by performing an exclusive OR operation on the error position signal EPS and the test codeword TCW corresponding to a zero codeword. Therefore, the decoding result data DRD may be the same as the error position signal EPS in the test mode. In the test mode, the read codeword RCW corresponding to the zero codeword may be referred to a test codeword.

In a normal mode, when a symbol SBLk includes an error, the data corrector 460 may correct the error in the symbol SBLk by performing an exclusive OR operation on the error position signal EPS and the read codeword RCW to output a corrected codeword C_CW. The data corrector 460 may correct errors whose number is the same as a number of data bits in one symbol.

Figure 23:
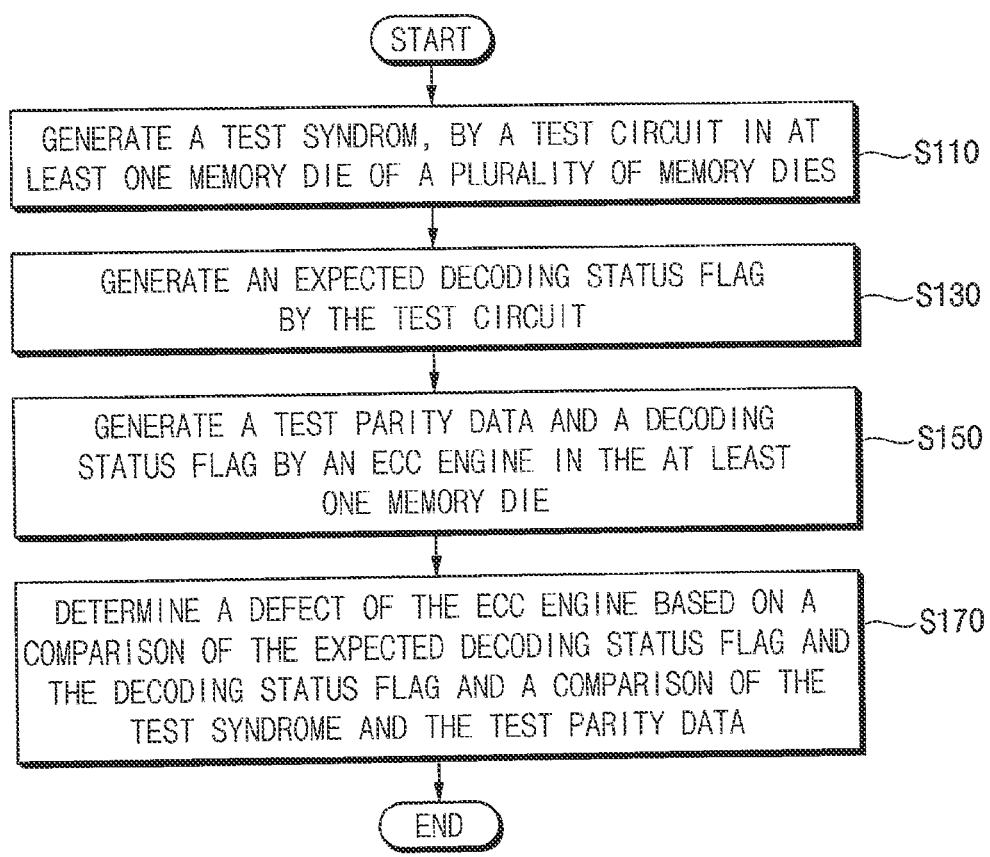
FIG. 23 is a flow chart illustrating a method of testing a semiconductor memory device according to exemplary embodiments.

FIG. 23 is a flow chart illustrating a method of testing a semiconductor memory device according to exemplary embodiments.

Referring to FIGS. 5 through 23, there is provided a method of testing a semiconductor memory device 70 which includes a buffer die 100 and a plurality of memory dies 200a~200d stacked on the buffer die 100. The memory dies 200a~200d are electrically connected to the buffer die 100 through a TSV 120. Each of the memory dies 200a~200d includes a memory cell array, a control logic circuit, an ECC engine and a test circuit.

According to the method, in a test mode, a test circuit 500a in at least one memory die of the memory dies 200a~200d generates a test syndrome T_SDR (operation S110). The test syndrome T_SDR may correspond to one of a plurality of error patterns. The test syndrome T_SDR may include test error magnitude syndrome T_SDR_M indicating a number of errors and a test error locator syndrome T_SDR_L indicating a position of a symbol including the error.

The test circuit 500a generates an expected decoding status flag EDSF corresponding to the test syndrome T_SDR and indicating a status of the error (operation S130).

An ECC engine 400a in the at least one memory die generates a test parity data TPRT and a decoding status flag DSF1 associated with a status of error based on the test syndrome T_SDR (operation S150). The ECC engine 400a may provide the test parity data TPRT and the decoding status flag DSF to the test circuit 500a.

The test circuit 500a determines whether the ECC engine 400a has a defect based on a comparison of the expected decoding status flag EDSF and the decoding status flag DSF1 and a comparison of the test syndrome T_SDR and the test parity data TPRT (operation S170). The test circuit 500a may provide the buffer die 100 with a decision signal DS indicating whether the ECC engine 400a has a defect through the TSV 120 and the buffer die 100 may transmit the decision signal DS to an external device.

Figure 24:
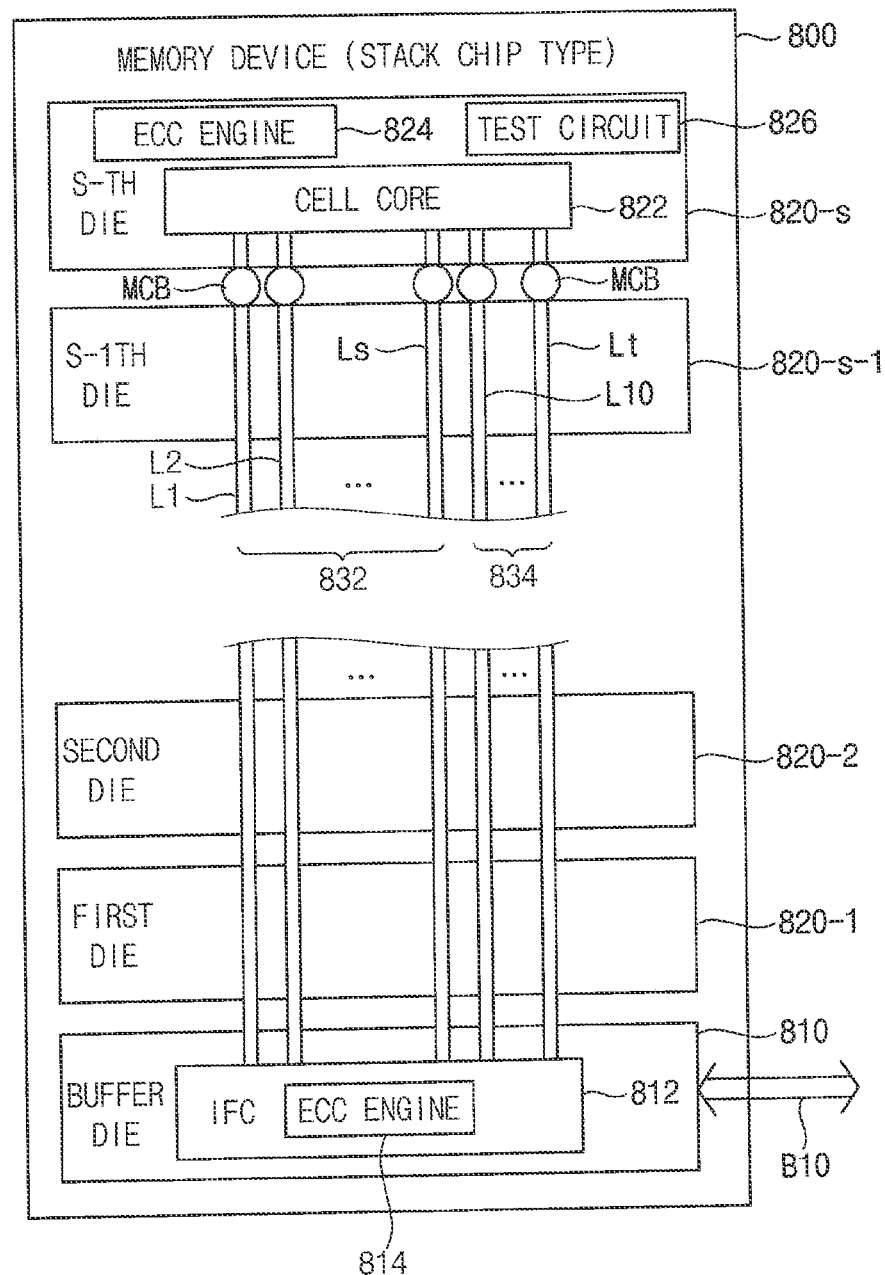
FIG. 24 is a block diagram illustrating a semiconductor memory device according to exemplary embodiments.

FIG. 24 is a block diagram illustrating a semiconductor memory device according to exemplary embodiments.

Referring to FIG. 24, a semiconductor memory device 800 may include at least one buffer die 810 and plurality of memory dies 820-1 to 820-s (s is an integer greater than two) which is stacked on the at least one buffer die 810 providing a stacked chip structure.

The plurality of memory dies 820-1 to 820-s are stacked on the at least one buffer die 810 and conveys data through a plurality of through substrate vias (or, through silicon via (TSV)) lines.

Each of the memory dies 820-1 to 820-s may include a cell core 822 to store data and parity, an ECC engine 824, and a test circuit 826. The ECC engine 824 and the test circuit 826 may employ the ECC engine 400a and the test circuit 500a in FIG. 9, respectively.

Therefore, the ECC engine 824, in a normal mode, may perform a RS encoding on a data to be stored in the cell core 824 and may perform a RS decoding on a data read from the cell core 822 to correct an error in the read data. The test circuit 826, in a test mode, may generate a test syndrome and an expected decoding status flag associated with an error status of the test syndrome, may receive a test parity data generated by the ECC engine 824 based on the test syndrome and a decoding status flag associated with error status of the test parity data, and may determine whether the ECC engine 824 has a defect based on comparison of the test syndrome and the test parity data and a comparison of the expected decoding status flag and the decoding status flag.

The buffer die 810 may include an interface circuit 812 and the interface circuit 812 may include an ECC engine 814.

The ECC engine 814 may be referred to as a via ECC engine and may correct transmission error provided from at least one of the memory dies 820-1 to 820-s.

A data TSV line group 832 which is formed at one memory die 620-s may include a plurality of TSV lines L1 to Lt, and a parity TSV line group 834 may include a plurality of TSV lines L10 to Lt. The TSV lines L1 to Ls of the data TSV line group 832 and the parity TSV lines L10 to Lt of the parity TSV line group 834 may be connected to micro bumps MCB which are correspondingly formed among the memory dies 820-1 to 820-s.

The semiconductor memory device 800 may have a three-dimensional (3D) chip structure or a 2.5D chip structure to communicate with the host through a data bus B10. The buffer die 810 may be connected with the memory controller through the data bus B10.

Figure 25:
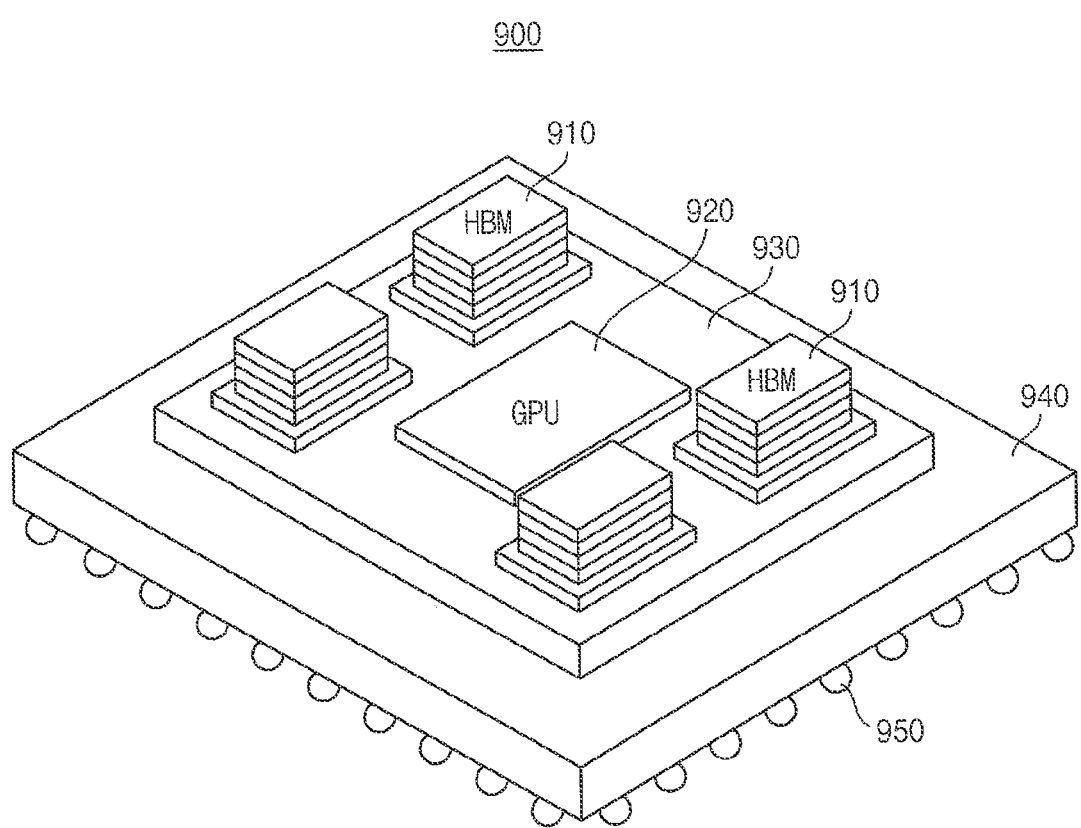
FIG. 25 is a diagram illustrating a semiconductor package including the stacked memory device according to exemplary embodiments.

FIG. 25 is a diagram illustrating a semiconductor package including the stacked memory device according to exemplary embodiments.

Referring to FIG. 25, a semiconductor package 900 may include one or more stacked memory devices 910 and a GPU 920.

The stacked memory devices 910 and the GPU 920 may be mounted on an interposer 930, and the interposer on which the stacked memory device 910 and the GPU 920 are mounted may be mounted on a package substrate 940.

The GPU 920 may perform the same operation as the memory controller 20 in FIG. 2 or may include the memory controller 20. The GPU 920 may store data, which is generated or used in graphic processing, in the stacked memory devices 910.

The stacked memory device 910 may be implemented in various forms, and the stacked memory device 910 may be a memory device in a high bandwidth memory (HBM) form in which a plurality of layers are stacked. Accordingly, the stacked memory device 910 may include a buffer die and a plurality of memory dies.

Each of the memory dies includes a memory cell array, a control logic circuit, an ECC engine and a test circuit.

Therefore, the ECC engine, in a normal mode, may perform a RS encoding on a data to be stored in the memory cell array and may perform a RS decoding on a data read from the memory cell array to correct an error in the read data.

The test circuit, in a test mode, may generate a test syndrome and an expected decoding status flag associated with an error status of the test syndrome, may receive a test parity data generated by the ECC engine based on the test syndrome and a decoding status flag associated with an error status of the test parity data, and may determine whether the ECC engine has a defect based on comparison of the test syndrome and the test parity data and a comparison of the expected decoding status flag and the decoding status flag The control logic circuit may control the ECC engine and the test circuit.

The plurality of stacked memory devices 910 may be mounted on the interposer 930, and the GPU 920 may communicate with the plurality of stacked memory devices 910. For example, each of the stacked memory devices 910 and the GPU 920 may include a physical region, and communication may be performed between the stacked memory devices 910 and the GPU 920 through the physical regions.

Aspects of the present inventive concept may be applied to various systems that employ semiconductor memory devices and stacked memory devices and whether an ECC engine has a defect is determined based on various error patterns.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present disclosure. Accordingly, all such modifications are intended to be included within the scope of the present invention as defined in the claims.

What is claimed is:

1. A semiconductor memory device comprising:
a buffer die configured to communicate with an external device; and
a plurality of memory dies stacked on the buffer die and configured to connect to the buffer die through a plurality of through silicon vias (TSVs),
wherein each of the plurality of memory dies includes:
a memory cell array which includes a plurality of memory cell rows, each including a plurality of volatile memory cells coupled to a plurality of word-lines and a plurality of bit-lines;
an error correction code (ECC) engine, in a normal mode, configured to perform Reed-Solomon (RS) encoding on data stored in the memory cell array and configured to perform a RS decoding on data read from the memory cell array to correct an error of the read data by unit of a symbol; and
a test circuit, in a test mode, configured to:
generate a test syndrome and an expected decoding status flag indicating error status of the test syndrome;
receive a test parity data and a decoding status flag, the test parity data generated by the ECC engine based on the test syndrome, the decoding status flag indicating error status of the test parity data; and
determine whether the ECC engine has a defect based on comparison of the test syndrome and the test parity data and a comparison of the expected decoding status flag and the decoding status flag.

2. The semiconductor memory device of claim 1, wherein the test circuit includes:
an error magnitude syndrome generator configured to, in the test mode, output a test error magnitude syndrome and a first selection signal associated with a selected error pattern, the test error magnitude syndrome indicating a number of errors in the test syndrome, associated with the selected error pattern which is selected from a plurality of error patterns;
an error locator syndrome generator configured to generate a test error locator syndrome indicating a position of a symbol including the error by multiplying the test error magnitude syndrome by an alpha matrix corresponding to the error in the test syndrome;
an expected decoding status flag generator configured to select one of a plurality of expected decoding status flags in response to the first selection signal to output the expected decoding status flag corresponding to the selected error pattern;
a decoding status flag comparator configured to compare the expected decoding status flag with the decoding status flag to output a first comparison result signal indicating whether the expected decoding status flag matches the decoding status flag;
a syndrome comparator configured to compare the test syndrome and the test parity data to output a second comparison result signal indicating whether the test syndrome matches the test parity data, the test syndrome including the test error magnitude syndrome and the test error locator syndrome; and
a decision logic configured to output a decision signal indicating whether the ECC engine has a defect based on the first comparison result signal and the second comparison result signal.

3. The semiconductor memory device of claim 2, wherein the decision logic is configured to determine that the ECC engine has a defect in response to at least one of the first comparison result signal and the second comparison result signal indicating no matching.

4. The semiconductor memory device of claim 2, wherein the decision logic is configured to provide the decision signal to the buffer die through a portion of the plurality of TSVs, and the buffer die is configured to transmit the decision signal to the external device.

5. The semiconductor memory device of claim 2, wherein the error magnitude syndrome generator includes:
a plurality of registers configured to store a plurality of seeds corresponding to the plurality of error patterns;
an error number selection logic configured to generate the first selection signal for selecting the plurality of seeds sequentially;
a multiplexer configured to select one of the plurality of seeds in response to the first selection signal; and
a linear feedback shift register configured to generate the test error magnitude syndrome based on an output of the multiplexer.

6. The semiconductor memory device of claim 5, wherein the plurality of error patterns include a pattern associated with no errors, error patterns included in the unit of symbol and an uncorrectable error pattern exceeding an error correction capability of the ECC engine.

7. The semiconductor memory device of claim 2, wherein the error locator syndrome generator includes:
a plurality of multipliers configured to multiply the test error magnitude syndrome by a plurality of alpha matrixes different from each other and a zero sub matrix, the plurality of alpha matrixes corresponding to a plurality of symbols, respectively;
an error position selection logic configured to generate a second selection signal designating a position of a symbol including the error, in the test mode; and
a multiplexer configured to select one of outputs of the plurality of multipliers and the test error magnitude syndrome in response to the second selection signal to output the test error locator syndrome.

8. The semiconductor memory device of claim 2, wherein the expected decoding status flag generator includes:
a plurality of registers configured to store a plurality of expected decoding status flags corresponding to the plurality of error patterns; and
a multiplexer configured to select one of the plurality of expected decoding status flags in response to the first selection signal to output the expected decoding status flag.

9. The semiconductor memory device of claim 2, wherein the syndrome comparator is configured to output the second comparison result signal by comparing the test error magnitude syndrome with an error magnitude parity in the test parity data and by comparing the test error locator syndrome with an error locator parity in the test parity data.

10. The semiconductor memory device of claim 2, wherein the syndrome comparator is configured to output the second comparison result signal by comparing a result of an exclusive OR operation of the test error magnitude syndrome and the test error locator syndrome with an error magnitude parity in the test parity data.

11. The semiconductor memory device of claim 1, wherein the ECC engine includes:
a RS decoder configured to generate the decoding status flag and decoding result data by performing the RS decoding on the test syndrome in the test mode; and
a syndrome generator configured to generate the test parity data by RS encoding on the decoding result data based in a parity generation matrix.

12. The semiconductor memory device of claim 11, wherein the RS decoder includes:
an error locator syndrome generator configured to generate a comparative test error locator syndrome indicating a position of an error by multiplying a test error magnitude syndrome indicating a number of errors in the test syndrome by an alpha matrix corresponding to the error in the test syndrome;
a comparator configured to output a comparison signal by comparing a test error locator syndrome indicating a position of the error in the test syndrome with the comparative test error locator syndrome;
a decoding status flag generator configured to generate the decoding status flag generator based on the test syndrome and the comparison signal;
an error position generator configured to generate an error position signal indicating a position of the error based on the comparison signal; and
a data corrector configured to generate the decoding result data based on the error position signal and a test codeword.

13. The semiconductor memory device of claim 11, wherein the ECC engine further includes:
a first multiplexer configured to output one of a main data and a test codeword based on a coding mode signal;
a memory configured to store the parity generation matrix and a parity check matrix;
a second multiplexer configured to select one of an output of the first multiplexer and the decoding result data in response to a test mode signal to provide the selected one to the syndrome generator, the test mode signal designating the test mode; and
a third multiplexer configured to select one of an output of the syndrome generator and the test syndrome in response to the test mode signal to provide the selected one to the RS decoder.

14. The semiconductor memory device of claim 13, wherein the first multiplexer, in response to the coding mode signal, is configured to:
select the main data in an encoding operation; and
select the test codeword in a decoding operation of the test mode.

15. The semiconductor memory device of claim 13, wherein the second multiplexer, in response to the test mode signal, is configured to:
select the decoding result data in the test mode; and
select the output of the first multiplexer in a normal mode.

16. The semiconductor memory device of claim 13, wherein the third multiplexer, in response to the test mode signal, is configured to:
select the test syndrome data in the test mode; and
select the output of the syndrome generator in a normal mode.

17. The semiconductor memory device of claim 1, wherein the semiconductor memory device corresponds to a high bandwidth memory (HBM).

18. A semiconductor memory device comprising:
a memory cell array which includes a plurality of memory cell rows, each including a plurality of volatile memory cells coupled to a plurality of word-lines and a plurality of bit-lines;
an error correction code (ECC) engine, in a normal mode, configured to perform a Reed-Solomon (RS) encoding on data stored in the memory cell array and configured to perform a RS decoding on data read from the memory cell array to correct an error of the read data by unit of a symbol;
a test circuit, in a test mode, configured to:
generate a test syndrome and an expected decoding status flag associated with the test syndrome;
receive a test parity data and a decoding status flag, the test parity data generated by the ECC engine based on the test syndrome, the decoding status flag associated with the test parity data; and
determine whether the ECC engine has a defect based on comparison of the test syndrome and the test parity data and a comparison of the expected decoding status flag and the decoding status flag; and
a control logic circuit configured to control the ECC engine and the test circuit based on a command and an address from an external device.

19. The semiconductor memory device of claim 18, wherein the test circuit includes:
an error magnitude syndrome generator configured to, in the test mode, output a test error magnitude syndrome and a first selection signal associated with a selected error pattern, the test error magnitude syndrome indicating a number of errors in the test syndrome, associated with the selected error pattern which is selected from a plurality of error patterns;
an error locator syndrome generator configured to generate a test error locator syndrome indication a position of a symbol including the error by multiplying the test error magnitude syndrome an alpha matrix corresponding to the error in the test syndrome;
an expected decoding status flag generator configured to select one of a plurality of expected decoding status flags in response to the first selection signal to output the expected decoding status flag corresponding to the selected error pattern;
a decoding status flag comparator configured to compare the expected decoding status flag with the decoding status flag to output a first comparison result signal indicating whether the expected decoding status flag matches the decoding status flag;
a syndrome comparator configured to compare the test syndrome and the test parity data to output a second comparison result signal indicating whether the test syndrome matches the test parity data, the test syndrome including the test error magnitude syndrome and the test error locator syndrome; and
a decision logic configured to output a decision signal indicating whether the ECC engine has a defect based on the first comparison result signal and the second comparison result signal,
wherein the decision logic is configured to transmit the decision signal to the external device through a separate pin.

20. A semiconductor memory device comprising:
a buffer die configured to communicate with an external device; and
a plurality of memory dies stacked on the buffer die and configured to connect to the buffer die through a plurality of through silicon vias (TSVs), wherein each of the plurality of memory dies includes:
a memory cell array which includes a plurality of memory cell rows, each including a plurality of volatile memory cells coupled to a plurality of word-lines and a plurality of bit-lines;
an error correction code (ECC) engine, in a normal mode, configured to perform a Reed-Solomon (RS) encoding on data stored in the memory cell array and configured to perform a RS decoding on data read from the memory cell array to correct an error of the read data by unit of a symbol; and
a test circuit, in a test mode, configured to:
generate a test syndrome and an expected decoding status flag indicating error status of the test syndrome;
receive a test parity data and a decoding status flag, the test parity data generated by the ECC engine based on the test syndrome, the decoding status flag indicating error status of the test parity data; and
determine whether the ECC engine has a defect based on comparison of the test syndrome and the test parity data and a comparison of the expected decoding status flag and the decoding status flag,
wherein the test circuit is configured to generate the test syndrome and the expected decoding status flag sequentially with respect to a plurality of error patterns,
wherein the ECC engine is configured to generate the decoding status flag and the test parity data based on the test syndrome that is sequentially generated, and
wherein the test circuit is configured to determine a defect of the ECC engine based on the expected decoding status flag, the test parity data and the test syndrome that is sequentially generated.

* * * * *